United States Patent [19]
Nemazie

[11] Patent Number: 5,864,568
[45] Date of Patent: Jan. 26, 1999

[54] SEMICONDUCTOR MEMORY DEVICE FOR MASS STORAGE BLOCK ACCESS APPLICATIONS

[75] Inventor: Siamack Nemazie, San Jose, Calif.

[73] Assignee: Cirrus Logic, Inc., Fremont, Calif.

[21] Appl. No.: 885,320

[22] Filed: Jun. 30, 1997

Related U.S. Application Data

[63] Continuation of Ser. No. 421,652, filed as PCT/US96/05106 Apr. 11, 1996, abandoned.

[51] Int. Cl.$^6$ .............................. G06F 13/00; G06F 13/12; G06F 11/10
[52] U.S. Cl. ........................................ 371/40.14; 395/876
[58] Field of Search .......................... 371/40.14; 395/876

[56] References Cited

U.S. PATENT DOCUMENTS

| | | | |
|---|---|---|---|
| 4,541,075 | 9/1985 | Dill et al. .................................. | 365/189 |
| 4,811,280 | 3/1989 | Berkowitz et al. ...................... | 395/440 |
| 4,965,801 | 10/1990 | DuLac ..................................... | 371/40.1 |
| 5,056,010 | 10/1991 | Huang ..................................... | 395/404 |
| 5,239,636 | 8/1993 | Dujari et al. ............................. | 395/872 |
| 5,280,601 | 1/1994 | Desai et al. .............................. | 395/405 |
| 5,317,713 | 5/1994 | Glassburn ................................ | 395/440 |
| 5,410,554 | 4/1995 | Watanabe ................................. | 371/40.1 |
| 5,465,343 | 11/1995 | Henson et al. ........................... | 395/439 |
| 5,551,054 | 8/1996 | Packer ..................................... | 395/843 |

FOREIGN PATENT DOCUMENTS

| | | | |
|---|---|---|---|
| 0 569 313 A2 | 11/1993 | European Pat. Off. .......... | G06F 3/06 |
| 0 622 726 A2 | 11/1994 | European Pat. Off. .......... | G06F 3/06 |

OTHER PUBLICATIONS

Lee et al., "An Advanced Winchester Disk Controller", 1989 Symposium on VLSI Technology, Systems and Applications, pp. 376–379, Dec. 1989.

Smith, The SARAM (Sequential Access and Random Access Memory), A New Kind of Dual–port Memory for Communications Now and Beyond, NorthCon/93, pp. 215–223, Dec. 1993.

*Primary Examiner*—Stephen M. Baker
*Attorney, Agent, or Firm*—Maryam Imam; Dan A. Shifrin

[57] ABSTRACT

In storage subsystems such as winchester disk, blocks of sequential data corresponding to sectors are concurrently accessed by the disk and the host. Semiconductor memory devices for storing block data are often utilized as storage location for sectors of data read or written to the disk and the host. Application of a semiconductor memory which increases the effective transfer rate of the system is highly desirable particularly in disk storage systems. A semiconductor memory for use in disk storage applications where information is transferred in blocks of data is hereby disclosed. Specifically, the memory includes a main memory configured as a random access memory array having rows and columns, each row having a plurality of n-bit words, a secondary memory having a data register file, first and second parallel-by-bit interfaces and a transferring circuit for transferring data between the main and secondary memories. Access to the main memory through a first interface is achieved independently of accesses to the secondary memory through a second interface thereby allowing concurrent accesses. Accordingly, concurrent and independent semiconductor memory accesses by any two utilization devices located externally to the memory such as a host, a disk sequencer, an ECC logic or a microcontroller are performed without corruption of the data. Further included in the secondary memory is a mask register file for maintaining the integrity of adjacent blocks of data when a block or sector of data having more words than the number of words in a row of the main memory is affected.

37 Claims, 19 Drawing Sheets

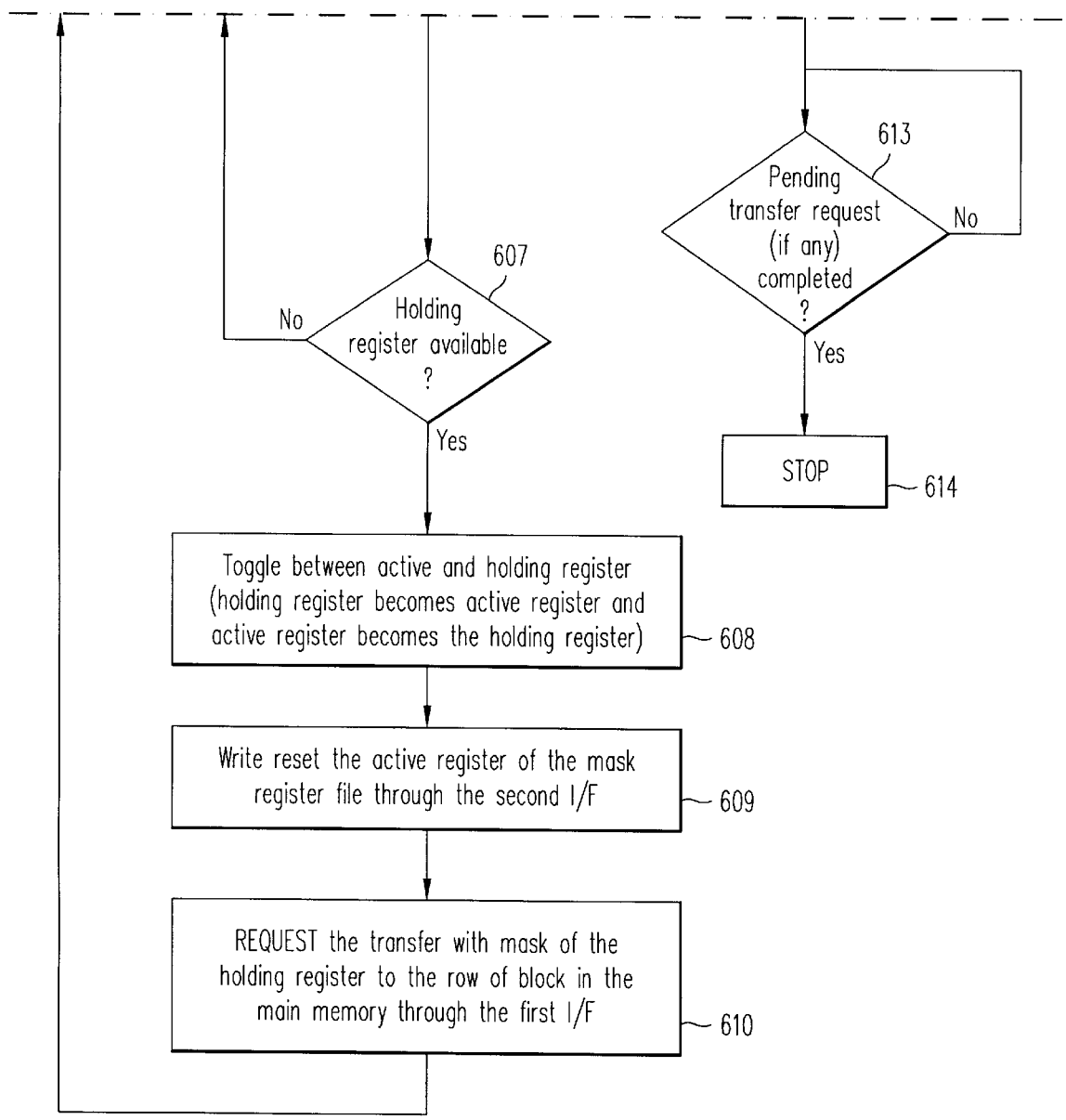
FIG. 14b
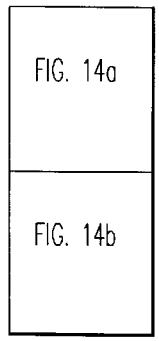
Key to

SEMICONDUCTOR MEMORY DEVICE FOR MASS STORAGE BLOCK ACCESS APPLICATIONS

CROSS REFERENCES

This application is a continuation of application Ser. No. 08/421,652, filed as PCT/US96/05106 Apr. 11, 1996 now abandoned.

FIELD OF THE INVENTION

This invention relates to integrated circuit semiconductor memories, and particularly to an improved semiconductor memory device for use in storage subsystems.

BACKGROUND OF THE INVENTION

FIG. 1 shows the block diagram of the electrical system 1 of a typical winchester disk drive storage subsystem, having a host interface 5, a disk interface 2–4, a serial interface 8, a microcontroller 10, a microcontroller data bus 6, a microcontroller address and control bus 7, a non-volatile semiconductor memory such as an Electrically Programmable Read Only Memory (EPROM) 20 for storing code executed by the microcontroller and, a code/data RAM 30 for storing parameters, and variables used by the microcontroller 10. A typical Winchester disk array storage system may also have a Controller 40, a local buffer RAM 50, a R/W Channel 60, a Motion Control 70, a Servo Driver 81, and a Motor Driver 82. The controller 40 includes a host Interface Control 41, Buffer Control 42, Sequencer 43, Error Checking and Correction (ECC) 44 and a first micro Interface 45. The Motion Control 70 includes a Servo Control 71, a Motor control 72, and a second micro Interface 73.

The local buffer RAM 50 is used for temporary storage of data between the host and storage system add and if the storage subsystem employs caching, then also for storage of cached data of the storage subsystem. The local buffer RAM 50 must support a bandwidth that allows the concurrent transfer of data from host, disk, ECC and the microcontroller. The buffer control 42 controls access to the local buffer 50, by different utilization devices, namely host, disk, on the fly correction circuitry of the ECC, and the microcontroller 10.

With the continuous increase in the disk transfer rates and the transfer rate at the host interface, the local buffer RAM must support higher bandwidth. The ATA-2 standard requires host transfer rates up to 22 Mbyte/sec. The SCSI-2 standard requires host transfer rates of 10/20 Mbytes/sec (8-bit SCSI bus/16-bit SCSI bus) and proposed UltraSCSI standard requires host transfer rates of 20/40 Mbytes/sec (8-bit SCSI bus/16-bit SCSI bus). The disk transfer rates are increasing to 10–20 Mbytes/sec. Therefore the local buffer RAM must support bandwidths of 20–60 Mbytes/sec. In the prior art in order to increase the buffer bandwidths, the size of buffer RAM data bus is increased to 16 or 32 bits. Bandwidths up to 40 MBytes/sec can be achieved with commercially available DRAMs having 16 bit data bus.

The code/data RAM 30 is used for storing parameters and variables used by the microcontroller firmware. It can also be used to store part of the firmware code that is executed by the microcontroller 10. A drawback of storing code only in ROM is that once ROM or EPROM is programmed, making changes is costly and requires scrapping ROMs which have been previously manufactured. Executing code from RAM provides the flexibility of making changes and/or additions to the code. In systems that execute code from RAM, the microcontroller executes the code from a boot ROM during power-on initialization to load the RAM with code which is stored on the storage media itself.

To reduce the cost of the electrical system of the storage subsystem, it is desirable to combine the local buffer RAM 50 with the code/data RAM 30. The ProDrive Low Profile Series 270/340/540 of 3.5-inch hard disk drives for AT and SCSI bus from Quantum Corporation employs an architecture in which the code/data RAM is combined with local buffer RAM, and the code/data used by the microcontroller (previously stored in a separate RAM) is also stored in the local buffer. In these drives the maximum disk transfer rate is 46 Mbits/sec. The drives for AT bus support ATA transfer rates of 6 Mbytes/sec in PIO mode and 13 MBytes/sec in Fast Multiword DMA mode. Drives for SCSI bus support transfer rates of 10 MBytes/sec in synchronous mode. In these drives, a conventional 64K×16 DRAM (part # TC511664) is used for local buffer RAM where 32K bytes of the RAM is used to store code used by the microcontroller.

As mentioned earlier and also evidenced by the performance of these drives, the conventional memories can not meet the requirements of a cost effective high performance storage subsystem.

A major improvement can be made if the microcontroller access and the access coupled through a buffer controller from other independent utilization devices (such as disk interface, host interface control) are separated.

Application specific multiport memories have been developed for serial scan applications such as video display systems which combine a DRAM with an on-board Serial Access Memory (SAM).

FIG. 2 shows an application specific memory according to U.S. Pat. No. 4,541,075, by Dill et al. having a row buffer register which can transfer rows of data to and from the main memory and a second Input/Output port for accessing the row buffer register in either serial or parallel mode. A limitation of the memory device described in this patent is that only one utilization device can independently use the second I/O port. Yet another limitation of the memory device proposed by Dill et al. is that partial write or masked write (writing only to selected words) from the row buffer register to a row of the main memory is not supported. In this memory device, the partial write can be emulated by "memory row read modify write" operation which includes the steps of: transferring the row from the main memory to the row buffer register, modifying the row buffer register through the second I/O port, and transferring the row buffer register back to the row of the main memory. This "memory row read modify write" operation assumes that the data of the same row in the main memory was not changed between the read and write back. Note that data corruption will occur if during "memory row read modify write" operation, part of the data in the main memory row was modified through the first I/O port. This is a general limitation of the prior art and will be discussed in more detail below.

Utilization or peripheral devices generally access a semiconductor memory through the memory's ports. Accesses by multiple utilization devices therefore require the semiconductor memory being accessed to have multiple ports to support independent utilization device accesses. A major limitation in providing access by multiple independent utilization devices through a dedicated port per utilization device is that concurrent write to the same row of the memory by two or more utilization devices is not possible without comprimising integrity of the data. FIG. 3 shows an extension of the memory device taught by Dill et al. In this patent further having a third I/O port for accessing a second row buffer independent of the first row buffer for use by a second utilization device. FIG. 4 shows two blocks in the main memory wherein the tail end of block 1 and beginning of block 2 are in the same row of the main memory (row 2). Consider an application in which the first utilization device is using first row buffer register through second I/O port and a second utilization device is using the second row buffer register through the third I/O port; and furthermore utilization device 1 is accessing block 1, and utilization device 2 is accessing block 2. Now consider the following sequence of operations in this example: utilization device 1 reads row 2 of the memory into the first row buffer register and starts modifying the first row buffer register through the second I/O port, utilization device 2 read the same row of memory into the second row buffer register and starts modifying the second row buffer register through the third I/O port, utilization device 1 completes modifying the beginning of the row buffer register which is part of block 1 and writes it back to the row of the memory, utilization device 2 completes modifying the tail end of the second row buffer register which is part of the block 2 and writes it back to the row of the memory. It should be apparent that the last operation will then overwrite the data of block 1 which was modified by utilization device 1 and causes data corruption.

Yet another data corruption resulting from "memory row read modify write" operation unique to storage subsystem applications will be discussed next. Consider an execution of a read command by the storage subsystem during which blocks are read from the disk and disk interface (first utilization device) will be writing blocks of data to the memory, and concurrently good blocks which are buffered in the memory are read by the host interface (second utilization device). During this operation if an error occurs when a block is read from the media and transferred from disk interface to buffer, then the on-board "on the fly correction (OFC)" circuitry of the ECC will attempt to correct the correctable errors concurrent with the transfer of the next block from the disk interface. The case in which the error was located at the tail end of the blocks, which is in the same row of the memory as the beginning of the next block, will be considered. This case may use the following sequence of operations: utilization device reads the row of the memory into the first row buffer register and starts modifying the first row buffer register through the second I/O port, the OFC circuitry locates an error in the same row of the memory and corrects the error through the first I/O port, utilization device completes modifying the tail end of the row buffer register which is the beginning of block and writes it back to the row of the memory, which will then overwrite the data which was corrected by the OFC circuitry and cause data corruption.

These types of a problems, in order to be avoided, place a restriction on memory utilization such that if a subset of memory rows are dedicated for each block, which requires that either the data block to be multiple of a row size (which may not be always possible) or waste some part of the memory.

Furthermore, multiple parallel-by-bit I/O ports each coupled to a utilization device increases the number of the pins of the memory device package, which increases the cost of the memory device.

There is a need for a cost effective high performance multiport memory for block access applications such as disc drive applications that allows independent access by multiple utilization devices coupled through a buffer controller to a second parallel-by-bit I/O port.

BRIEF SUMMARY OF THE INVENTION

An object of this invention is to increase the effective transfer rate of a semiconductor memory.

Another object of this invention is to provide access to random access memory through first and second ports for increasing the effective transfer rate of the memory device.

Yet another object of the present invention is to separate sequential memory access by multiple independent utilization devices through the second port from the random memory access through the first port.

A specific application of the present invention is to improve system performance when combining microcontroller RAM with buffer RAM in a storage subsystem which allows execution of code from buffer with simultaneous transfers between disk interface and buffer, host interface and the buffer, and memory access for error correction. In said application, a specific object of the invention is to provide data to utilization device at the requested transfer rate without any interruption in the transfer.

According to the present invention, a semiconductor memory device is configured to provide improved system performance in block oriented applications such as storage subsystem. Specifically, the present invention includes a main memory configured as a dynamic random access memory array, combined with a secondary memory having a data register file and a mask register file, a second parallel-by-bit interface for random accesses to the data and mask register files, and means for transferring data between the main memory array and the data register file.

According to the present invention, data from a row of the main memory array can be transferred on a column-by-column basis into a register of the data register file, each of which have the same number of bits as in a row of the main memory array. Furthermore, any combination of words within a register of the data register file can be transferred into a row of the main memory array wherein the combination of the words is selected by the contents of corresponding register of the mask register file.

An important aspect of the present invention is that sequential accesses are done through the second interface and the data register file, and random access to any word within the register files can be performed through the second interface.

Furthermore, in order to minimize the accesses to the mask register file, a simultaneous write operation and a write reset operation to the register files are invented. In the simultaneous write operation when writing to a word of data register file, a predetermined pattern is simultaneously written to the corresponding word of the mask register file. This pattern corresponds to selecting all bits of the word when transferring with mask from data register file to the main memory. In the write reset operation, a second predetermined pattern is written to all the bits of the selected register of the register files. The second predetermined pattern corresponds to a pattern deselecting all the bits when transferring with mask from data register file to the main memory means.

In another embodiment of the present invention, means for independent sequential addressing of each register of the register file is included, which provides the address to select a word within a register of the register file during accesses to the register file through the second interface.

These and other objects, advantages, aspects and features of the present invention will be more fully understood and appreciated by those skilled in the art upon consideration of the following detailed description of a specific embodiment, presented in conjunction with the accompanying drawings.

BRIEF DESCRIPTIONS OF THE DRAWINGS

DETAILED DESCRIPTION OF A SPECIFIC EMBODIMENT

Figure 5A:
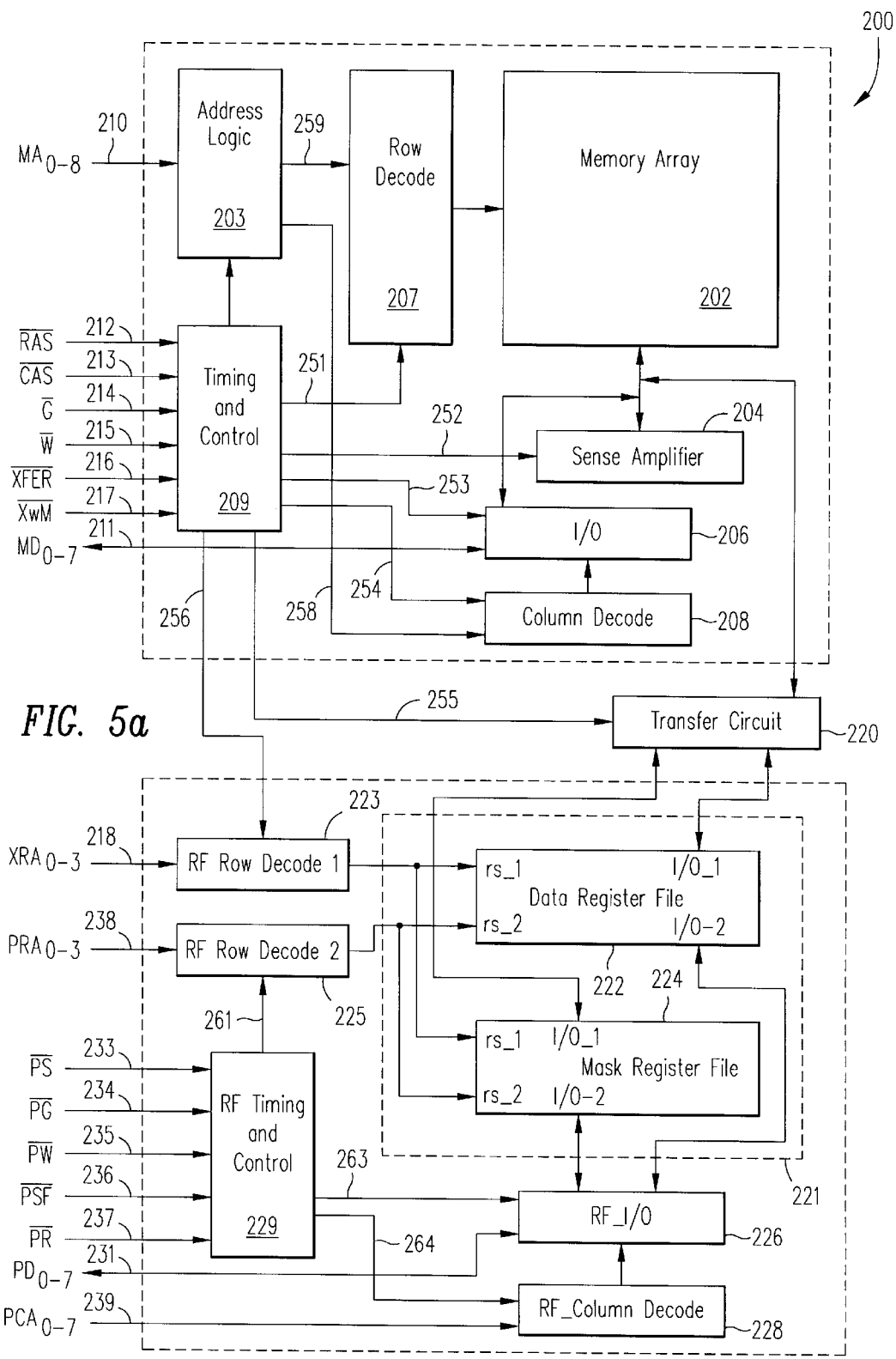
FIG. 5a is a block diagram showing the architecture of a memory device in accordance with one embodiment of the present invention.

Generally, memory such as random access memory (RAM) or read-only memory (ROM) is organized in rows and columns of storage locations. In block access applications, data transferred to and from memory is organized in blocks of sequential data. In such applications, the present invention increases system throughput and efficiency by allowing simultaneous accesses to the same block of memory data by external devices without corrupting data in surrounding blocks. An overall block diagram of the present invention is depicted in FIG. 5a. All of the logic blocks shown in FIG. 5a reside in a semiconductor memory device 200.

The random access memory system of the present invention has general application to block access applications, i.e. applications in which memory data comprises of blocks of sequential data, wherein complete blocks are accessed concurrently through a buffer controller which is coupled to a plurality of independent utilization devices. A storage subsystem such as a winchester disk is one such application wherein blocks of sequential data corresponding to sectors are concurrently accessed through a buffer controller by the disk interface (a first utilization device) and a host interface (a second utilization device). According to the specific embodiments of the present invention, a semiconductor memory device comprising a dynamic random access memory (DRAM) is presented. Although a dynamic RAM is used in this specific embodiment, the invention can, of course, be implemented using other types of memories. The structure of the present invention will be discussed first, next the functional operation of the present invention will be discussed, and then followed by application of the memory device in the electrical system of a winchester disk drive.

In FIG. 5a, memory device 200 includes a memory array 202 having storage locations arranged in rows and columns. Although other types and sizes can be utilized without departing from the spirit of the invention, the preferred embodiment memory array 202 is a 128K word DRAM. Coupled to memory array 202 through transfer logic 220, there is a secondary memory 221 with rows and columns of storage locations wherein the width of each row of the secondary memory is the same as the width of a row in the main memory. The secondary memory further can store at least one block of data having a size defined by the particular application using the memory device of the present invention. Accesses to the memory array 202 are through a first interface 210–218 which is additionally used to transfer data between memory array 202 and secondary memory 221. A second interface 231–239 allows accessing secondary memory 221.

The first interface includes an address ($MA_{0-8}$) port 210, data input/output ($MD_{0-7}$) ports 211, a row address strobe ($\overline{RAS}$) port 212, a column address strobe ($\overline{CAS}$) port 213, an output enable ($\overline{G}$) port 214, a write enable ($\overline{W}$) port 215, a transfer operation select ($\overline{XFER}$) port 216, a transfer with mask ($\overline{XwM}$) port 217, and a transfer row address ($XRA_{0-3}$) port 218.

The memory device 200 also includes a first control logic circuit means 209 for generating timing and control signals during accesses to main memory 202, and for transfers between the main memory 202 and secondary memory 221 in response to the input terminals 212–218. Address port 210 ($MA_{0-8}$) is coupled to address logic 203 located in memory device 200. Address logic 203 provides row address information 259 to row decode logic 207 and column address information 258 to column decode logic 208. Further included in memory device 200 is a sense amplifier circuit 204 having a plurality of sense amplifiers connected to each column of array 202 and a data input/output circuit means 206 coupled to data input/output ($MD_{0-7}$) port 211. The foregoing architecture is common to many known dynamic RAMs.

The second interface 231–239 of the memory device 200 includes a second parallel-by-bit data input/output ($PD_{0-7}$) port 231, second row address ($PRA_{0-3}$) ports 238, and second column address ($PCA_{0-8}$) ports 239. The second interface further includes a chip select ($\overline{PS}$) port 233, a second write enable ($\overline{PW}$) port 235, a second output enable ($\overline{PG}$) port 234, a function select ($\overline{PSF}$) port 236, and a reset ($\overline{PR}$) port 237.

The memory device 200 further includes a secondary memory 221 having a data register file 222, and a mask register file 224, and a control logic circuit 229 for controlling accesses to secondary memory 221 through data input/output port 231. Row decode circuit 225 selects a row of the secondary memory 221 during transfers between the secondary memory 221 and data input/output port 231, and row decode circuit 223 selects a row of the secondary memory during transfer between main memory 202 and the secondary memory 221. Input/output circuit 226 is coupled to column decode logic 228 and bidirectionally coupled to data I/O ($PD_{0-7}$) port 231.

The data register file 222 has a plurality of rows of dual port registers. The number of registers in a row is determined by the number of bits (size) associated with each register but each row must be as wide as a row in memory array 202. Data register file 222 has two independent data I/O ports. Furthermore, data register file 222 is coupled to row decode logic blocks 223 and 225 through corresponding row select ports located in data register file 222. Mask register file 224 is also configured as a dual port register file including plurality of rows of dual port registers and having its own two independent data I/O ports. Additionally, mask register file 224 is coupled to row decode logic blocks 223 and 225 through its corresponding row select ports.

Address ($MA_{0-8}$) port 210 is coupled to the address logic 203. The output of address logic 203 is coupled to the first row decode circuit means 207, and the first column decode circuit means 208. The output of the first row decode circuit means 207 is coupled to the rows of the main memory means 202. The column lines of the main memory means 202 are coupled to the sense amplifier circuit means 204, the transfer circuit means 220, and the first data I/O circuit means 206. The output of the first column decode circuit means 208 is coupled to first data I/O circuit means 206. The first data I/O circuit means 206 is coupled to the first data input/output ports 211. The transfer circuit means 220 is coupled between main memory means 202 and secondary memory means 221.

The first control logic circuit means 209 is coupled to ports 212–217 of the first interface. In FIG. 5a the coupling of the first control logic circuit means 209 to other components within the memory device 200 is represented diagrammatically by the output line 251, 252, 253, 254, 255, and 256. Output lines 251–256 represent the internal connections which are necessary to describe the structure and operation of this embodiment of the present invention.

Transfer row address ($XRA_{0-3}$) ports 218 are coupled to a third row decode circuit means 223. The output of the third row decode circuit means 223 is coupled to the first row select ports of the data register file 222, and the first row select ports of the mask register file 224.

The second row address ($PRA_{0-3}$) ports 238 are coupled to a second row decode circuit means 225. The output of the second row decode circuit 225 is coupled to the second row select ports of the data register file 222 and second row select ports of the mask register file 224.

The first data I/O ports of the data register file 222 are coupled to transfer circuit means 220 and the second I/O ports of the data register file 222 are coupled to the second data input/output circuit means 226. The first data I/O ports of the mask register file 224 are coupled to transfer circuit means 220 and the second I/O ports of the mask register file 224 are coupled to the second data input/output circuit means 226.

The second column address ($PCA_{0-7}$) ports 239 are coupled to second column decode circuit means 228. The output of the second column decode circuit means 228 is coupled to the second data input/output circuit means 226. The second data input/output circuit means 226 is coupled to the second data input/output port 231.

The second control logic circuit means 229 is coupled to ports 233–237 of the second interface. In FIG. 5a, the coupling of the second control logic circuit means 229 to other components within the memory device 200 is represented diagrammatically by output lines 261, 263, and 264 which are necessary to describe the structure and operation of this embodiment of the present invention.

Figure 9:
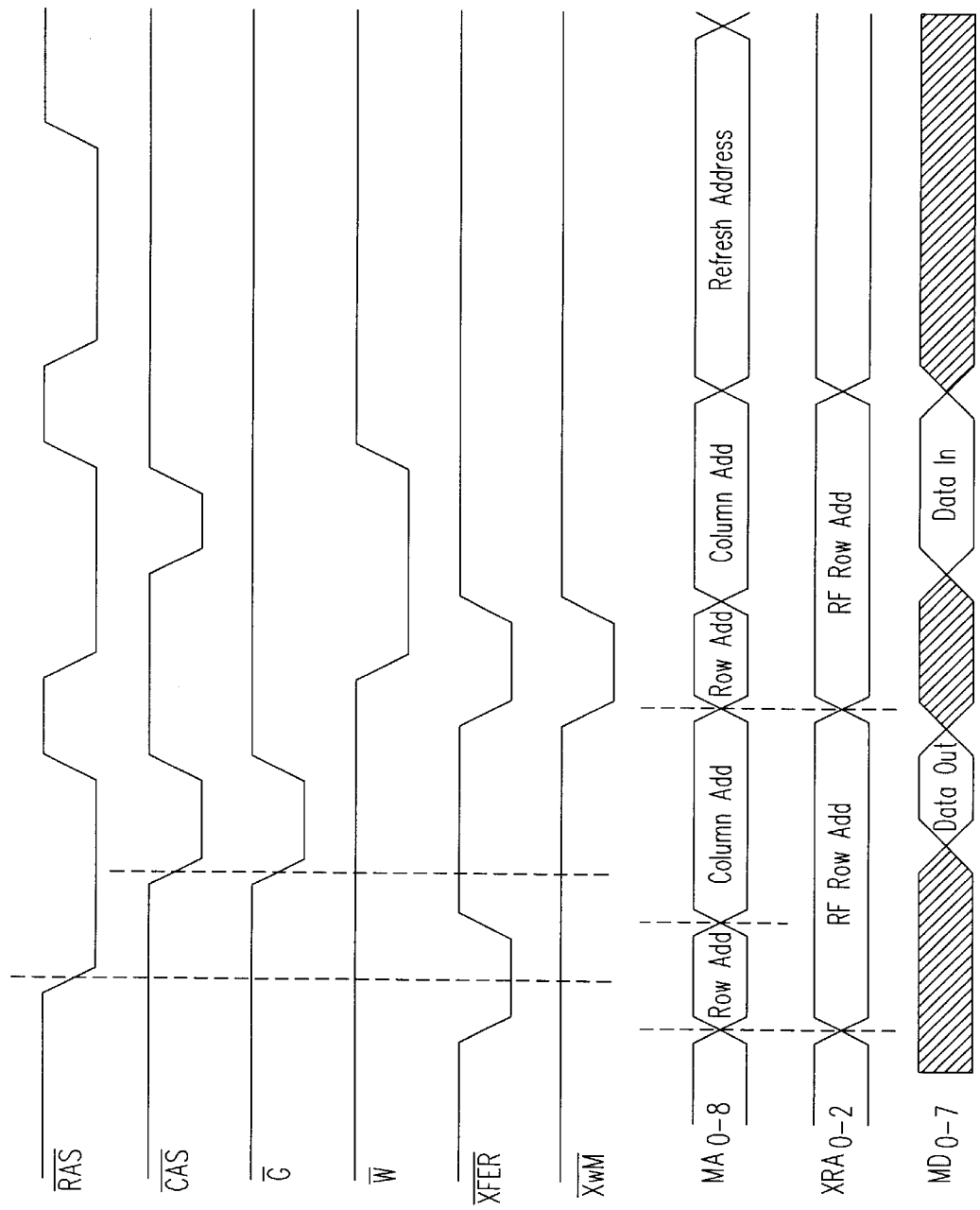
FIG. 9 illustrates the timing diagram for transferring between the main memory and the secondary memory.

The following description of the operation of the present inventions refers to the specific embodiment of the present invention shown in FIG. 5a and the timing diagrams shown in FIG. 9, and FIGS. 10 a–c.

When the signal on operation select ($\overline{XFER}$) port 216 is deasserted (logic level high) on the falling edge of signal $\overline{RAS}$ on port 212, the semiconductor memory 200 operates in a mode in which the main memory 202 and secondary memory 221 operate independently and can be separately and independently accessed through the first and second interfaces respectively. In this mode, the operation of main memory 202 is similar to commercially available DRAMs such as TMS48C128 from Texas Instruments Inc.

Upon assertion of a logical low level signal to the operation select ($\overline{XFER}$) port 216 and on the falling edge of the signal on the $\overline{RAS}$ port 212, the semiconductor memory 200 operates in a transfer mode in which data is transferred between main memory 202 and the secondary memory 221.

FIG. 9 shows the timing diagram for the transfer operation. Referring to FIG. 9, the transfer operation is invoked by low logic level signal on $\overline{XFER}$ port 216 on the falling edge of $\overline{RAS}$ 212. When the $\overline{RAS}$ 212 is asserted, it specifies that both the first row address is valid on the first address ($MA_{0-8}$) ports 210 which selects a row of the main memory means 202, and also the secondary memory row address is valid on the transfer row address ($XRA_{0-3}$) ports 218 selecting a row of the secondary memory means 221. The $\overline{RAS}$ 212 initiates the memory operation which causes the data in the form of capacitor charge from the specified row of the memory array 202 to be switched to the column lines. This row remains active until the $\overline{RAS}$ 212 is deasserted at the end of the memory cycle. The sense amplifiers sense the stored column charge and force the column voltage to a voltage corresponding to a logical '1' or '0' state based on the stored charge state. This also causes a refresh of the capacitor storage elements of the specified row of the memory array 202. In the transfer operation the write enable signal $\overline{W}$215 determines the transfer direction. When the $\overline{W}$215 is deasserted, the data will be transferred from the selected row of the main memory array 202 to the selected row of secondary memory 221. When the $\overline{W}$215 is asserted and $\overline{XwM}$217 is asserted on the falling edge of $\overline{W}$215, a combination of data from the selected row of data register file 222 will be transferred to the selected row of main memory array 202; wherein the combination is selected by the contents of the corresponding row of the mask register file 224. When the $\overline{W}$215 is asserted and $\overline{XwM}$217 is deasserted on the falling edge of $\overline{W}$215, data from the selected row of data register file 222 will be transferred to the selected row of main memory array 202 and the contents of the corresponding row of the mask register is ignored.

When $\overline{RAS}$212 is asserted after a certain address hold time, the row address can be removed from memory address terminals and subsequently the column address can be applied to the memory address lines. When the column address is valid, the $\overline{CAS}$ signal is asserted. During a transfer operation from memory array 202 to the secondary memory, if the memory output enable $\overline{G}$ is asserted, the word selected by the first column address will be driven on the first data input/output ports 211.

The functional operation of the secondary memory 221 as invoked by the control signals on $\overline{PS}$ port 233, $\overline{PG}$ port 234, $\overline{PW}$ port 235, $\overline{PSF}$ port 236, and $\overline{PR}$ port 237 are summarized in Table 1.

With signal on $\overline{PS}$ port 233 deasserted (logic level 1), no operation is selected. The signals on $PRA_{0-3}$ port 238 select one of the rows of the secondary memory 221. The signal on $PRA_3$ port selects either data register file or mask register file, and signals on $PRA_{0-2}$ ports select one of the 8 rows of the selected register file. The signals on $PCA_{0-7}$ port 239 select one of the words of the selected row of the secondary memory 221.

Figure 10A:
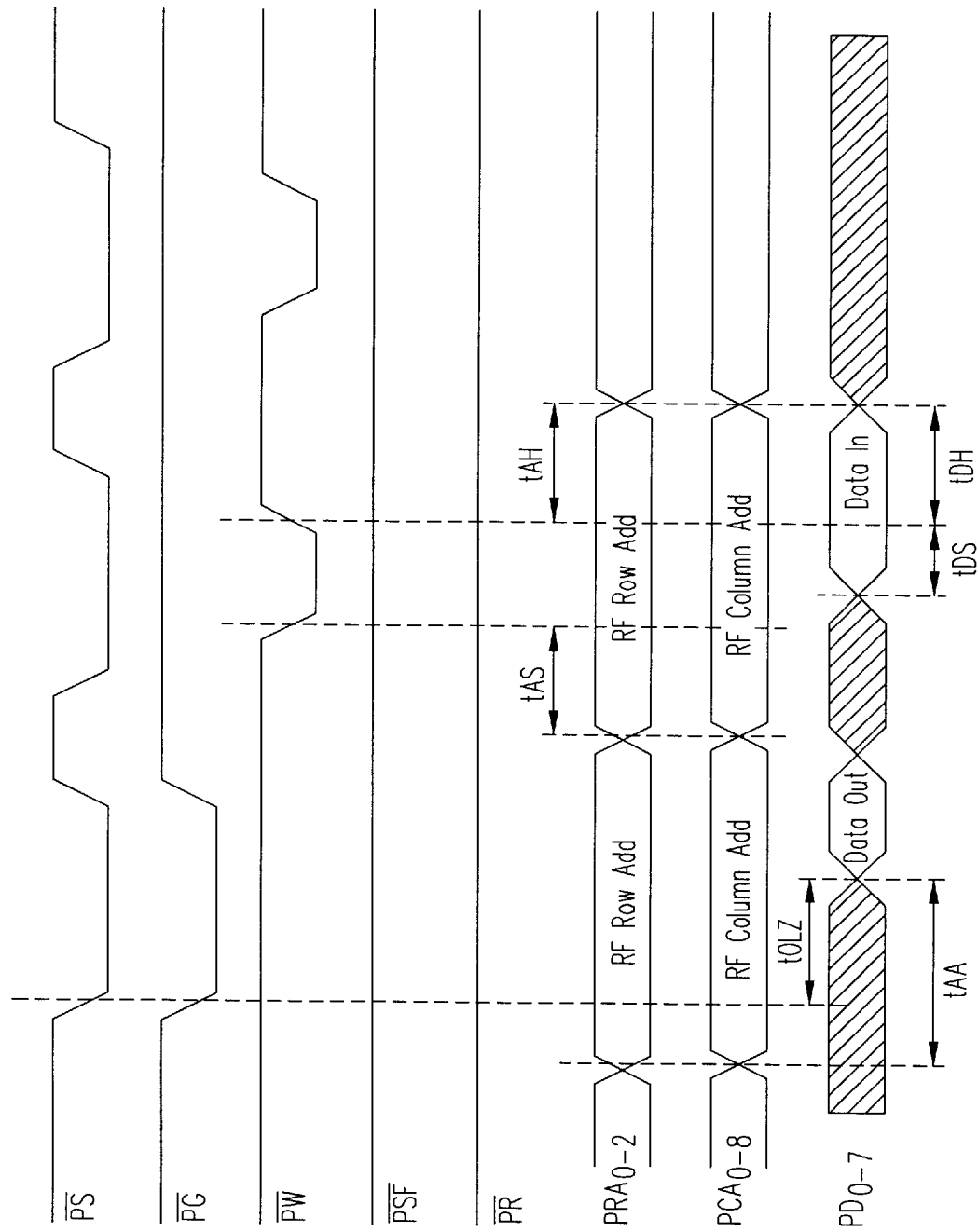
FIG. 10a illustrates the timing diagram of read and write operation of the secondary memory.

FIG. 10a shows the timing diagram for secondary memory 221 read and write operations. With signals on $\overline{PS}$ port 233 asserted (logic level 0), and $\overline{PW}$ port 235 deasserted (logic level 1), then after the latter of a $t_{AA}$ delay from valid address values on $PRA_{0-3}$ 238 and $PCA_{0-7}$ 239 or a $t_{OLZ}$ delay from the signal on $\overline{PG}$ port 234 asserted (logic level 0) the selected word from the secondary memory 221 will be driven on the $PD_{0-7}$ ports 231.

With signal on $\overline{PS}$ port 233 asserted (logic level 0), address signals on $PRA_{0-3}$ port 238 and $PCA_{0-7}$ port 239 must be valid for a minimum $t_{AS}$ before assertion of signal on $\overline{PW}$ port 235 and held valid until a minimum of $t_{AH}$ after negation of the signal on $\overline{PW}$ port 235. The signals on $PD_{0-7}$ ports 231 will be written to the selected word of the secondary memory. The signals on the $PD_{0-7}$ ports 231 must be valid a $t_{DS}$ before deassertion of signal on $\overline{PW}$ port 235 and held valid until a $t_{DH}$ after negation of signal on $\overline{PW}$ port 235.

Figure 10B:
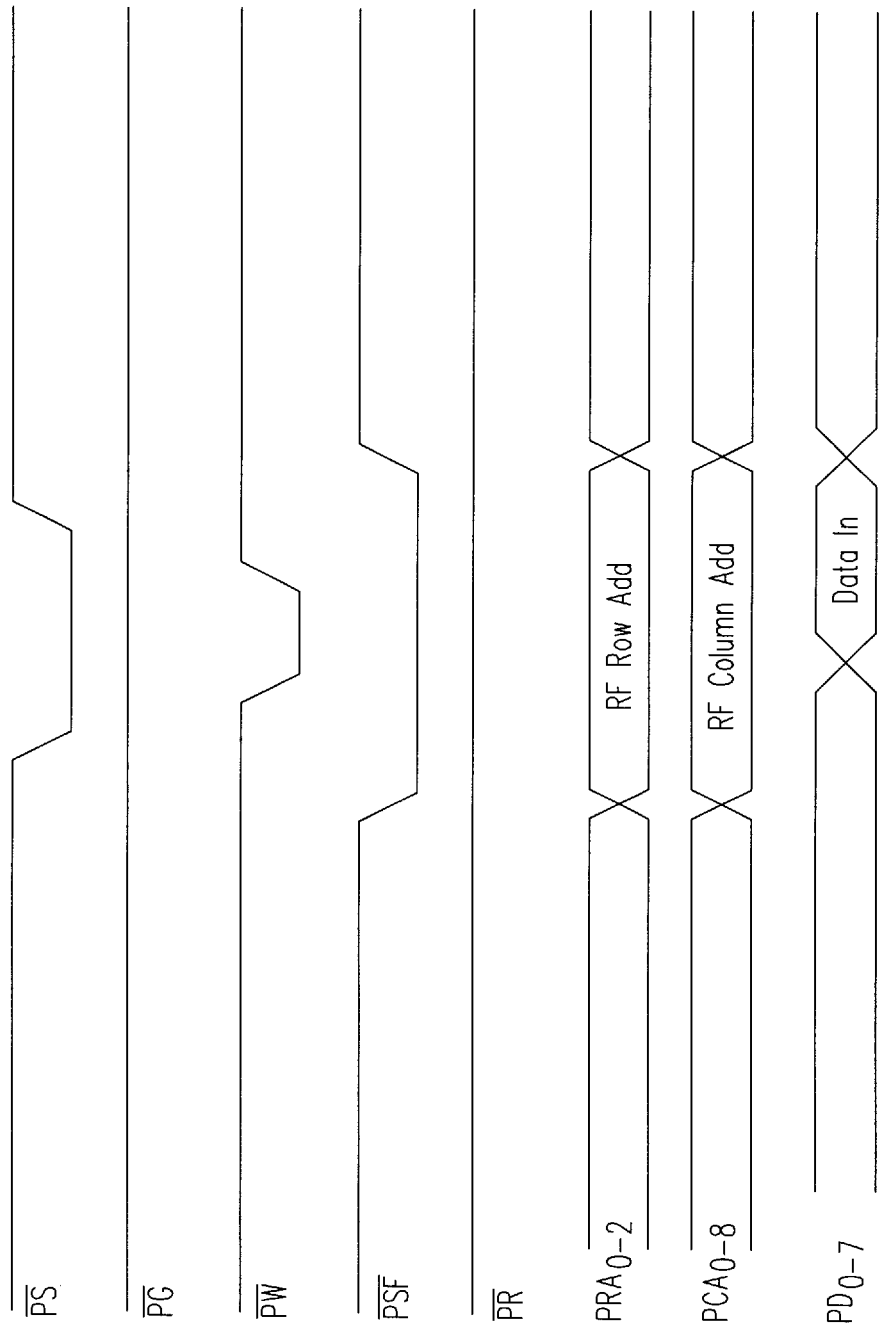
FIG. 10b illustrates the timing diagram of simultaneous write operation of the secondary memory.

FIG. 10b shows the timing diagram for secondary memory 221 simultaneous write operation. The simultaneous write operation is selected when, in a write operation, the signal on $\overline{PSF}$ port 236 is asserted (logic level 0) along with valid address signals on $PRA_{0-3}$ port 238 and $PCA_{0-7}$ port 239. In a simultaneous write operation, both data register file and mask register file are selected. The signals on $PRA_{0-2}$ port select a row of the data register file and a corresponding row in the mask register file. The signals on $PCA_{0-7}$ port 239 select a word of the selected rows of data register file and mask register file. The signals on $PD_{0-7}$ port 231 is written to the selected word of the data register file and a first predetermined pattern is written to the corresponding word of the mask register file. The first predetermined pattern corresponds to a pattern that selects all the bits of a word during a transfer with mask from the secondary memory 221 to the main memory 202. In this specification the pattern consists of all 1s pattern.

Figure 10C:
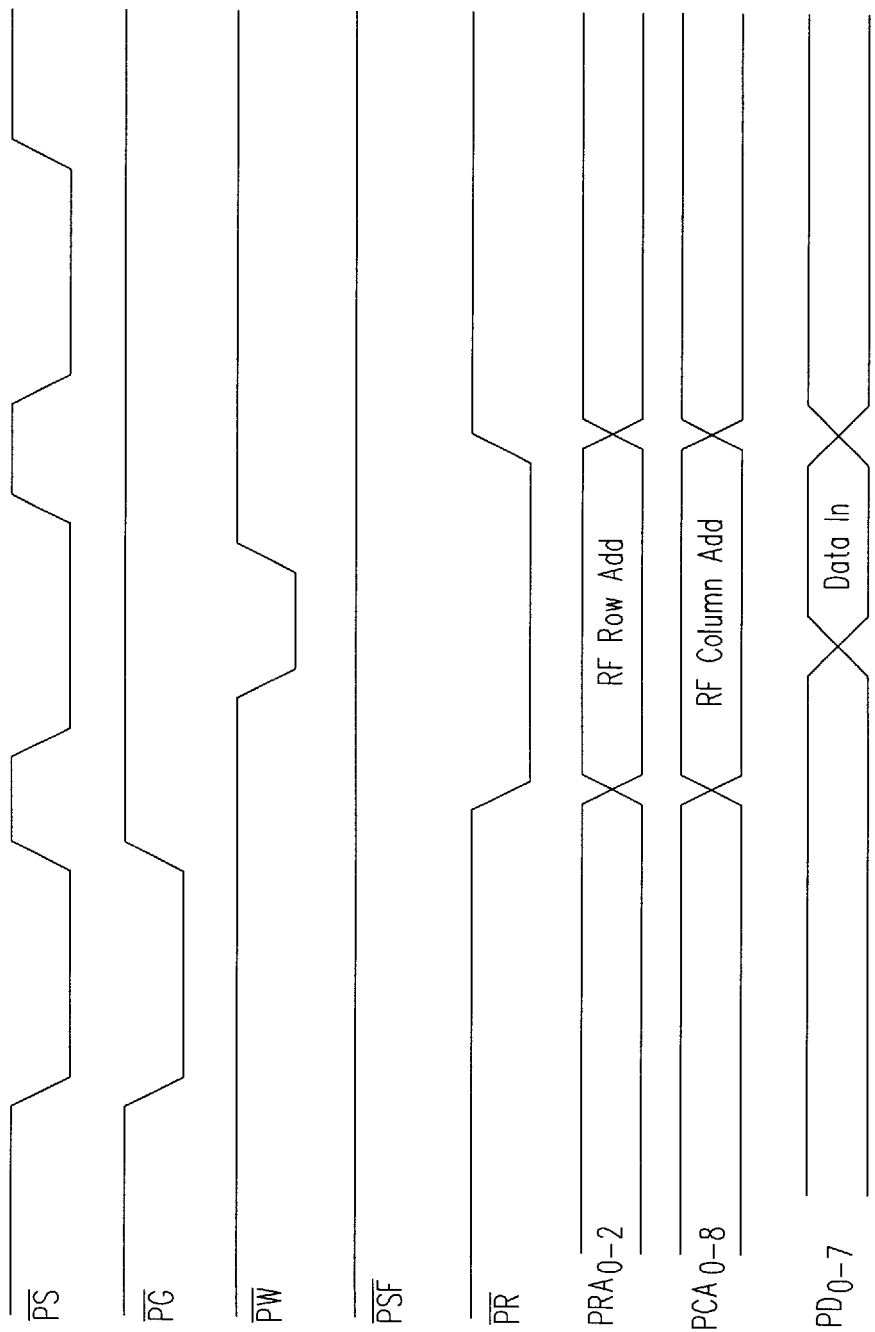
FIG. 10c illustrates the timing diagram of write reset operation of the secondary memory.

FIG. 10c shows the timing diagram for secondary memory 221 write reset operation. The write reset operation is selected when, in a write operation, the signal on $\overline{PR}$ port 237 is asserted (logic level 0) along with valid address signals on $PRA_{0-3}$ port 238 and $PCA_{0-7}$ port 239. In a write reset operation, a second predetermined pattern is written to all the words of the selected row of the secondary memory 221. The second predetermined pattern corresponds to a pattern that deselects all the bits of a row during a transfer with mask from the secondary memory 221 to the main memory 202. In this specification, the pattern consists of an all 0s pattern.

As mentioned earlier, the bandwidth on the second interface of RAM 55 exceeds 40 Mbytes/sec requirement of this application.

TABLE 1

Summary of second interface operations

| $\overline{PS}$ | $\overline{PG}$ | $\overline{PW}$ | $\overline{PSF}$ | $\overline{PR}$ | Operation |
|---|---|---|---|---|---|
| 1 | X | X | X | X | No operation selected |
| 0 | 0 | 1 | X | X | Read operation |
| 0 | X | 0 | 1 | 1 | Write Operation |
| 0 | X | 0 | 0 | 1 | Simultaneous Write operation:Write to data register, and write the enable write mask pattern to the corresponding mask register |
| 0 | X | 0 | X | 0 | Write Reset operation: Reset the selected row of the secondary memory |

Figure 5B:
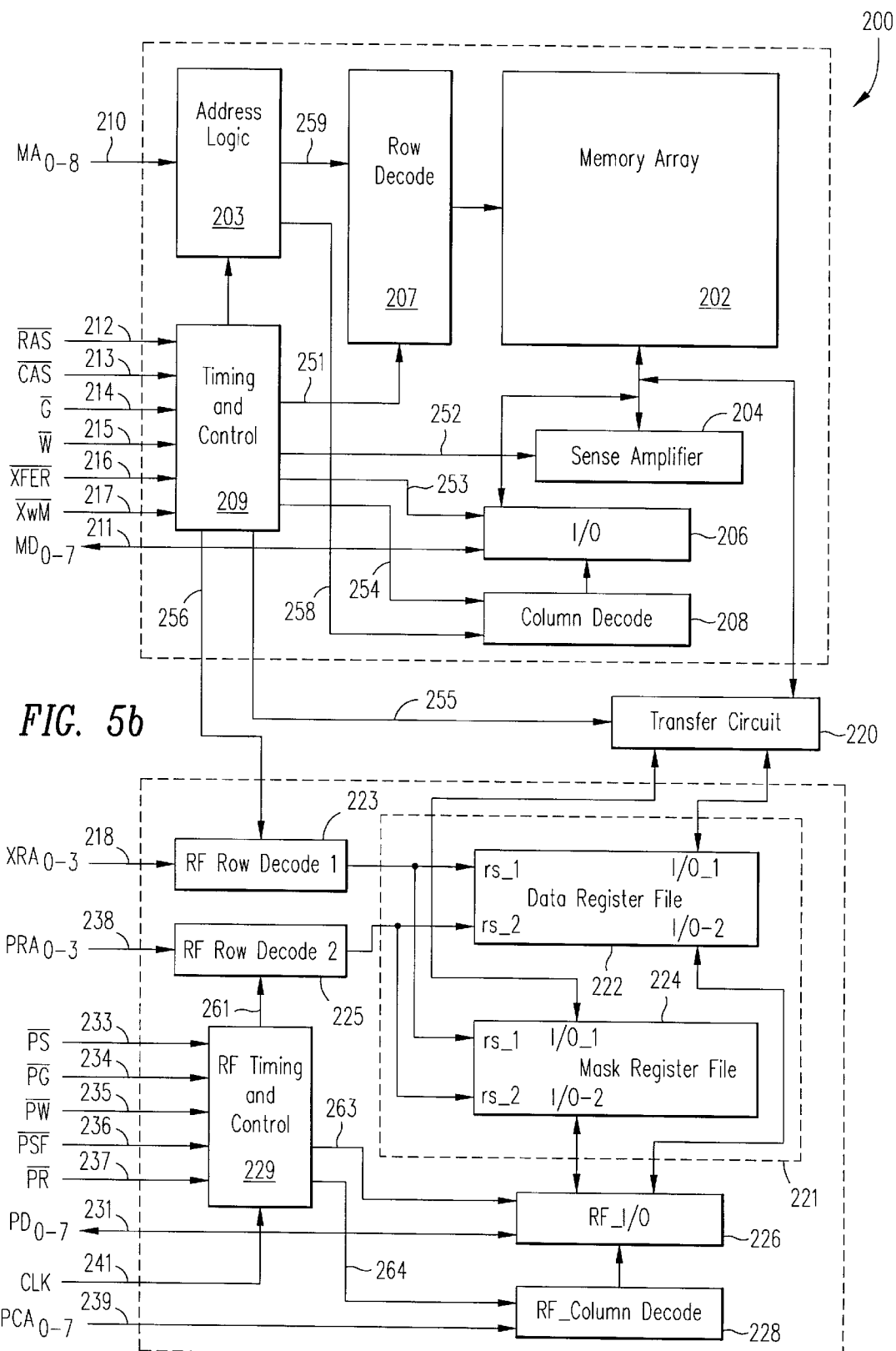
FIG. 5b is a block diagram of yet another embodiment of the invention having a clock (CLK) port wherein the operations through the second port are synchronized to the clock.
Figure 11:
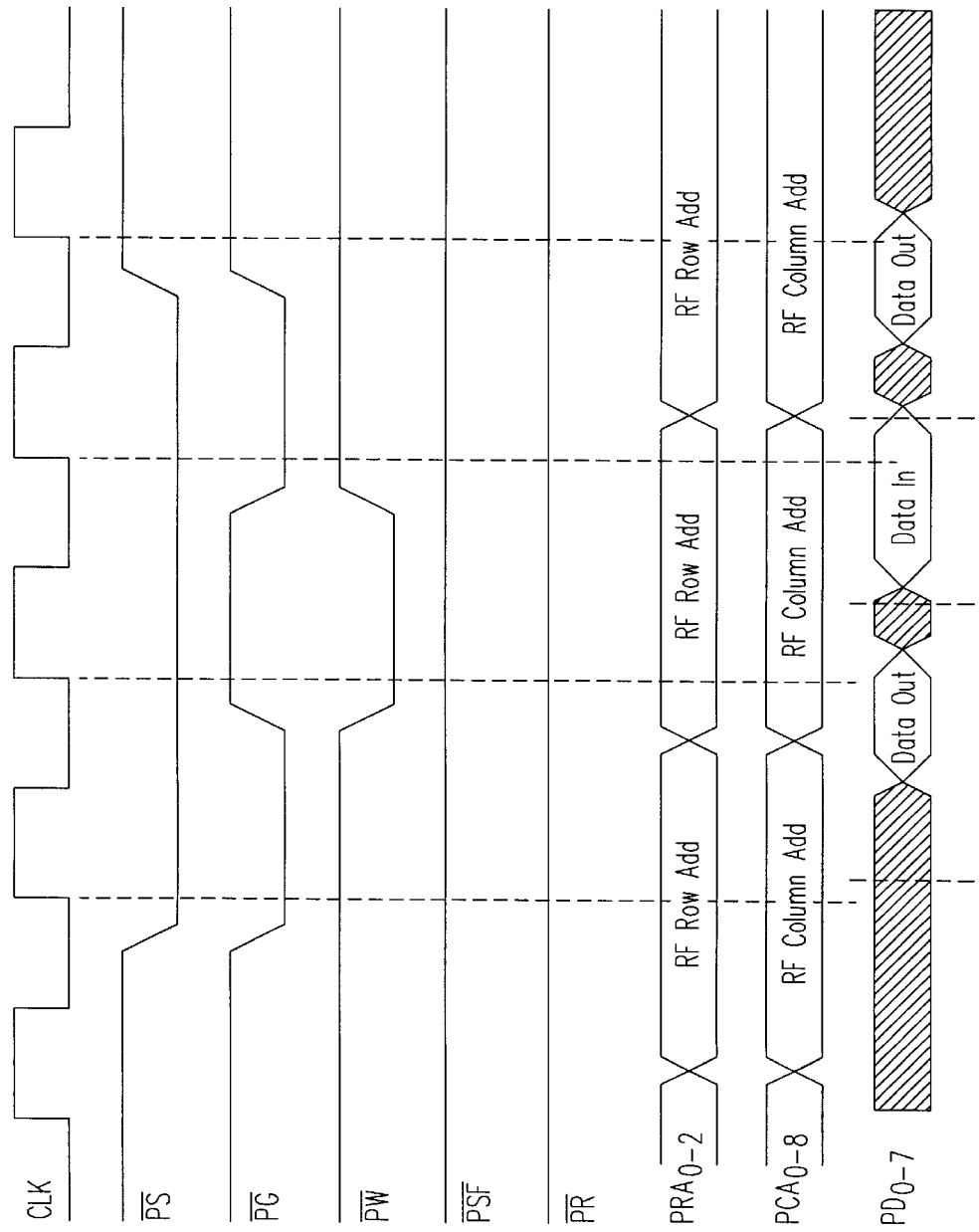
FIG. 11 illustrates the timing diagram of synchronous read and write operations of the secondary memory.

Referring now to FIG. 5b, there is shown yet another embodiment of the invention for achieving higher transfer rate through the second interface, and more flexible interface with a buffer controller. A clock (CLK) port 241 is added to the second interface and the operations (as summarized in table 1) of the second interface are synchronized with the signal on CLK port 241. All the address and control signals of the second interface are latched at the positive edge of the CLK. FIG. 11 illustrates an example of timing for synchronous read and write operation of second interface of memory device in FIG. 5b.

Figure 6:
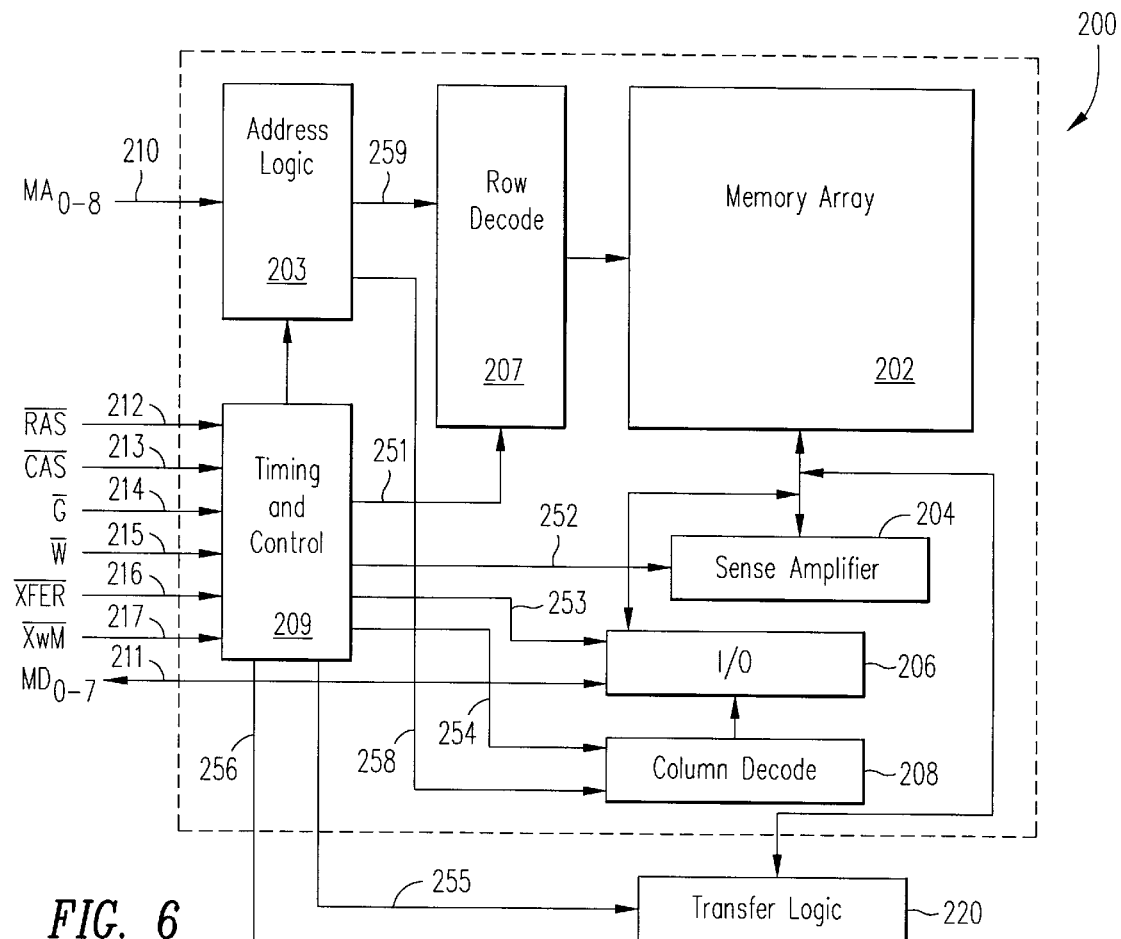
FIG. 6 is a block diagram of yet another embodiment of the invention using single port register file for the secondary memory.
Figure 6:
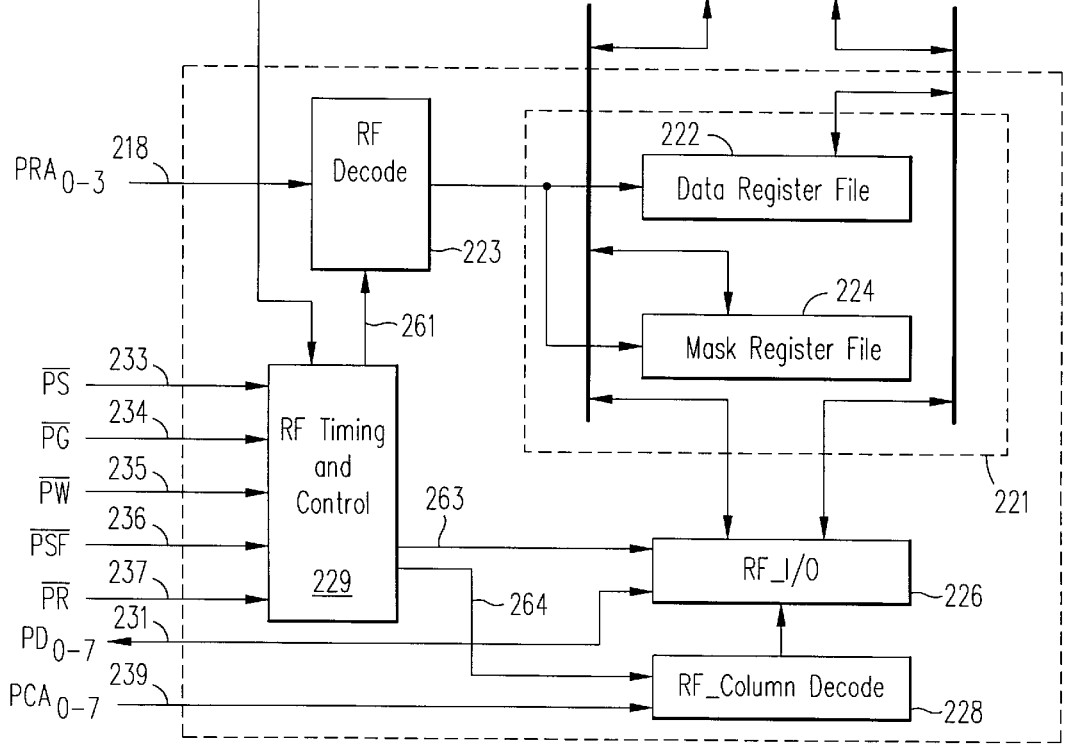

In yet another embodiment of the invention shown in FIG. 6, the data register file and the mask register file use a single port register file structure. The use of a single port register file instead of a dual port register file reduces the size of the secondary memory 221. However, the drawback is that the secondary memory cannot be accessed through the second interface simultaneously with transfers between secondary memory and main memory. Since such simultaneous operation is not possible anymore with a single port register file architecture, the pin count of the device can be reduced by eliminating $XRA_{0-3}$ port 218 depicted in previous figures and using $PRA_{0-3}$ port 238 during transfers between main memory and the secondary memory to provide the transfer address in the secondary memory. Furthermore, with a single port register file structure, a single register file row decode circuit means 223 is coupled to $PRA_{0-3}$ port 238. The use of single port register file reduces the cost of the secondary memory and reduces the pin count of the memory device but eliminates the flexibility of simultaneous operation.

Figure 7:
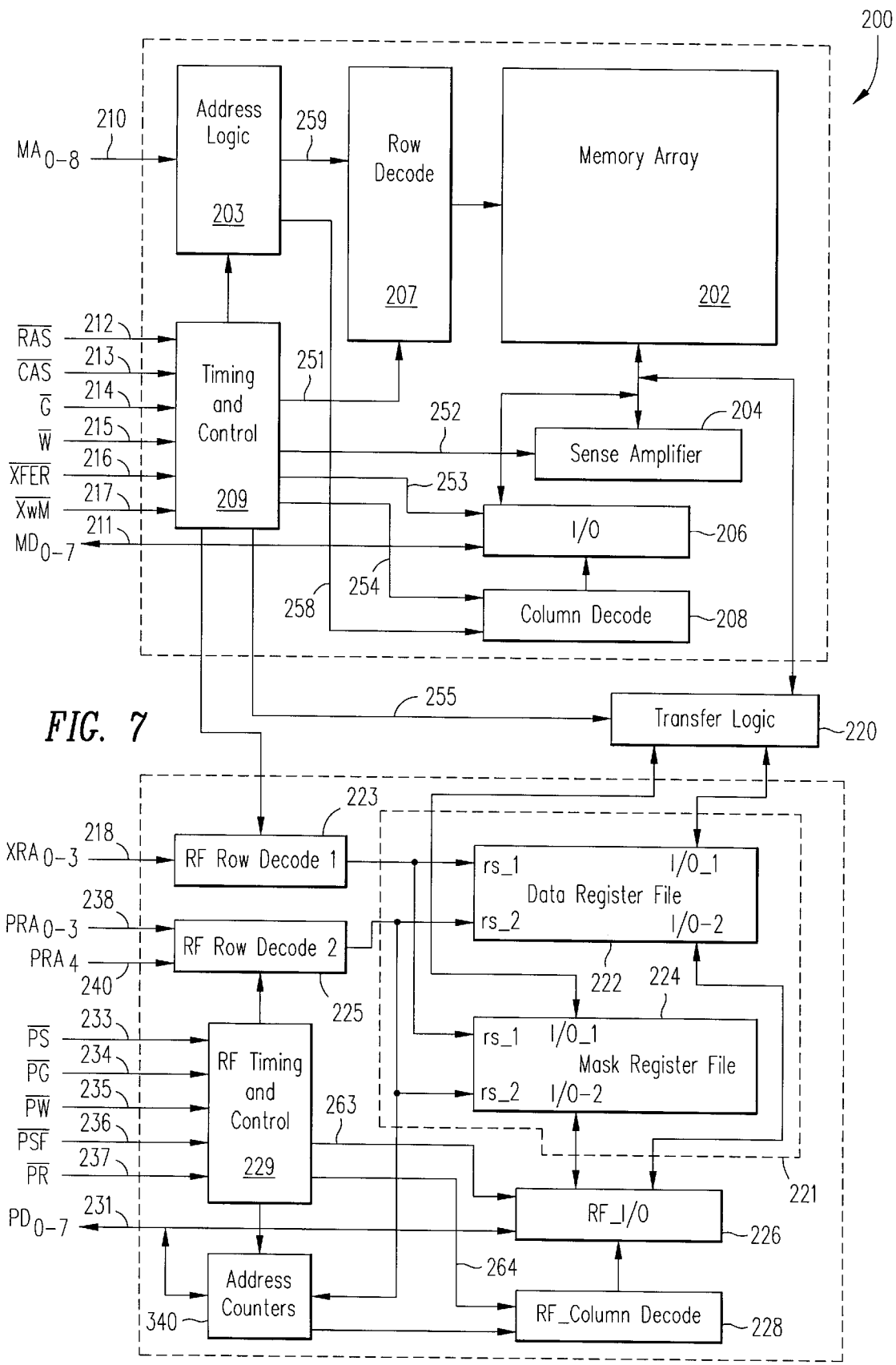
FIG. 7 is a block diagram of yet another embodiment of the invention having address counter means for sequential addressing of registers of the register file.
Figure 8:
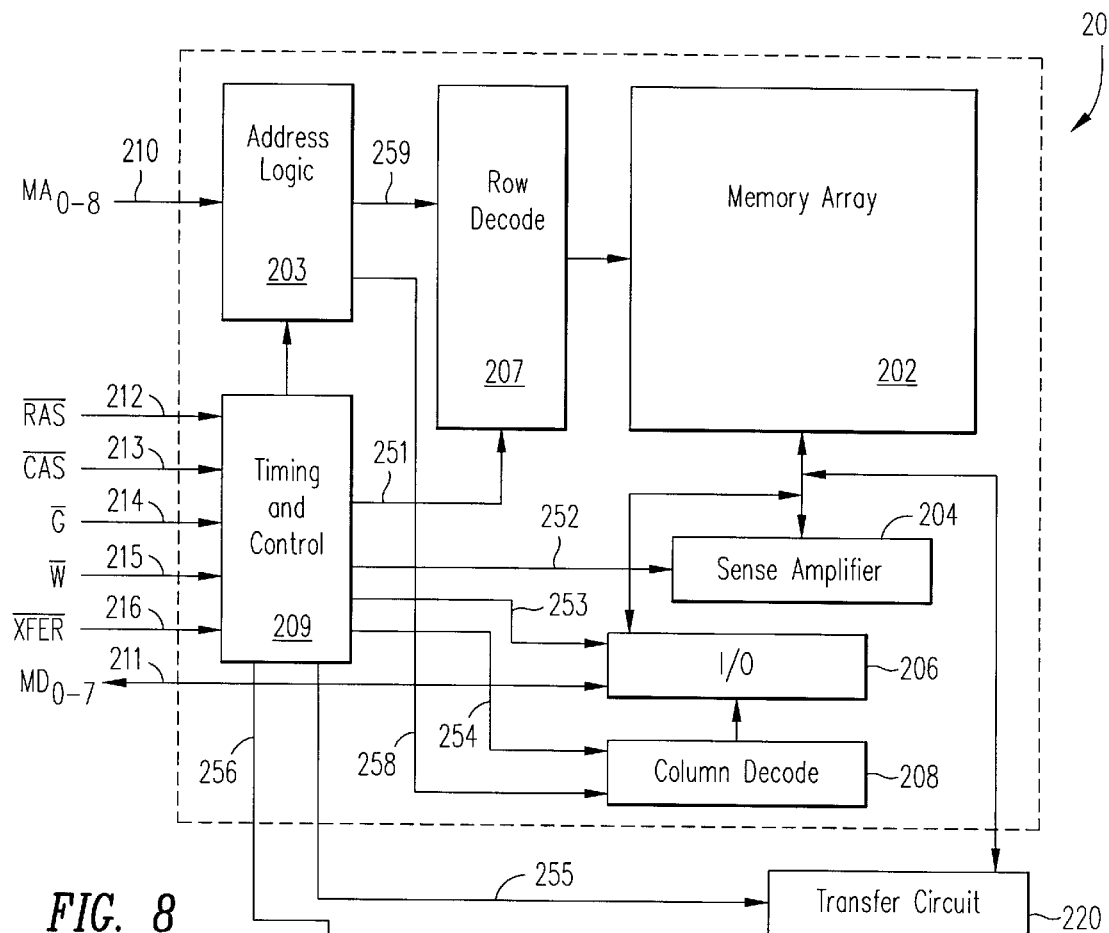
FIG. 8 is a block diagram of yet another embodiment of the invention for having only a data register file specifically for applications wherein each block consists of one or more complete rows of the main memory.
Figure 8:
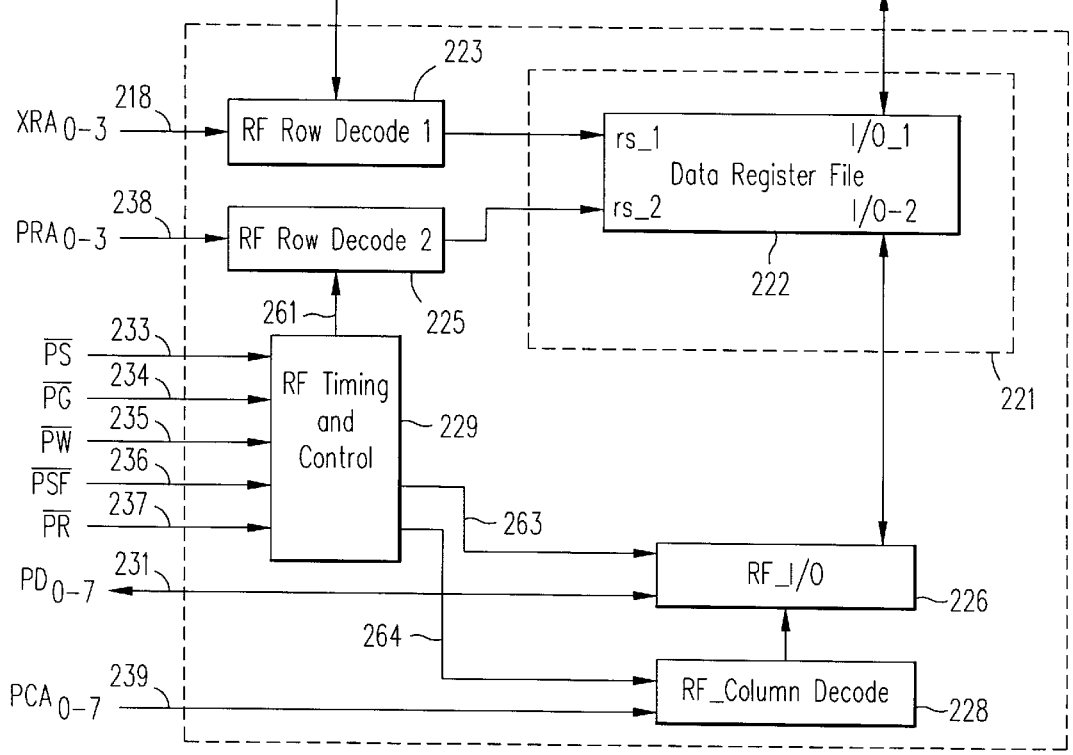

In still another embodiment of the invention shown in FIG. 7, an address counter means 340 is used to provide the sequential column addresses for the secondary memory access through the second interface. The address counter means include a counter associated with each row of the data register files, which can be initialized through the second interface. An additional $PRA_4$ port on the second interface in conjunction with $PRA_3$ selects either data register file, mask register file, or the address counter; and signals on $PRA_{0-2}$ select one of 8 rows of the selected register file or one of the 8 counters of the address counter means. When the address counter means is selected, the selected counter is accessed through signals on $PD_{0-7}$ port 231. When the register file is selected, the column address is provided by the associated counter within the address counter means 340, and the counter is incremented at the completion of the transfer cycle. The utility of this scheme is reduction of the memory device pins by eliminating $PCA_{0-7}$.

Another embodiment of the invention specifically for block access applications wherein all the block consist of plurality of complete rows of the main memory. In this application specific embodiment, the mask register file 224, transfer with mask between the data register file and the main memory, and transfer with mask ($\overline{XwM}$) port 217 are eliminated to reduce the cost of the memory device.

Figure 1:
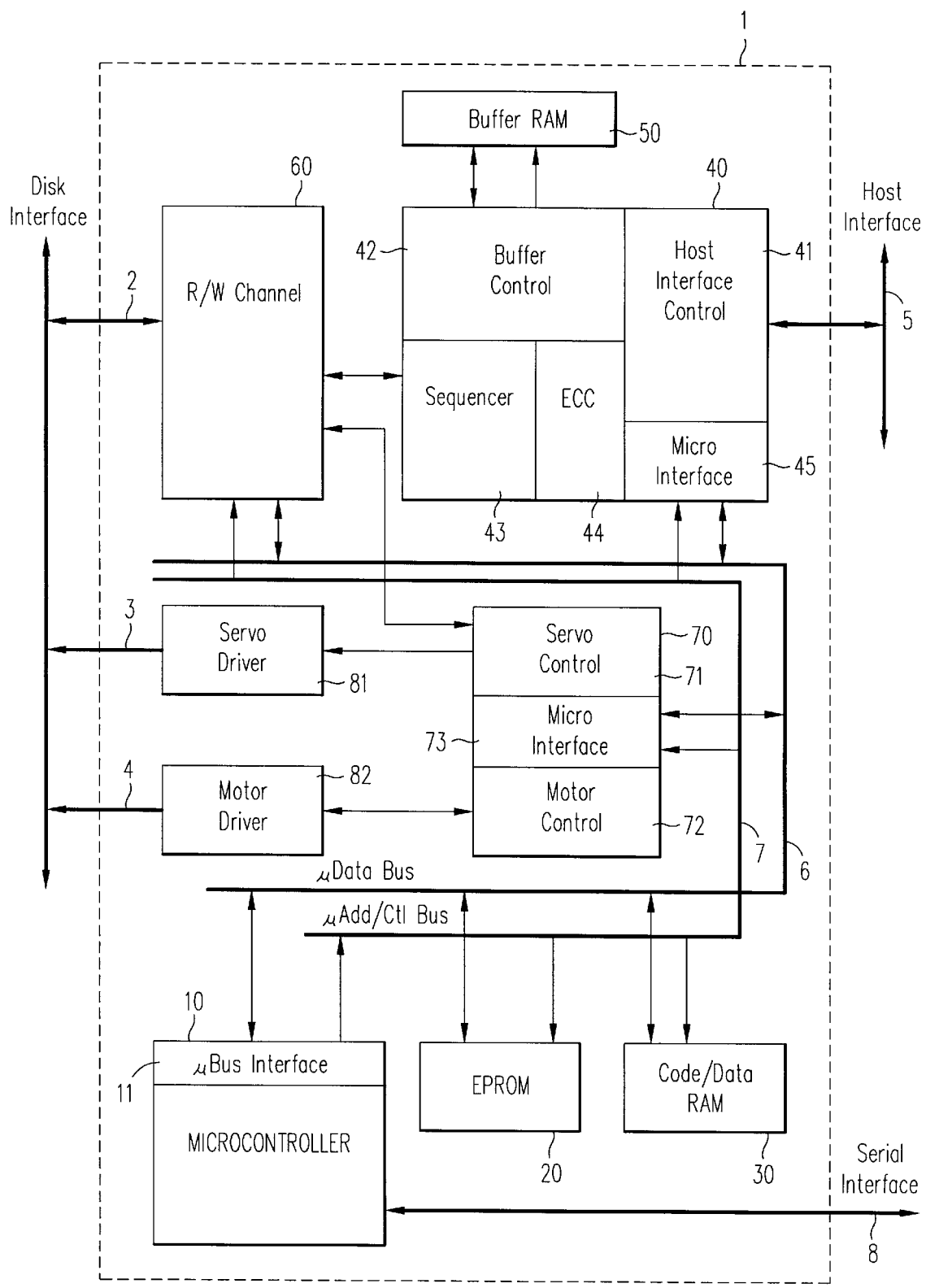
FIG. 1 shows the block diagram of the electrical system of a winchester disk drive.
Figure 2:
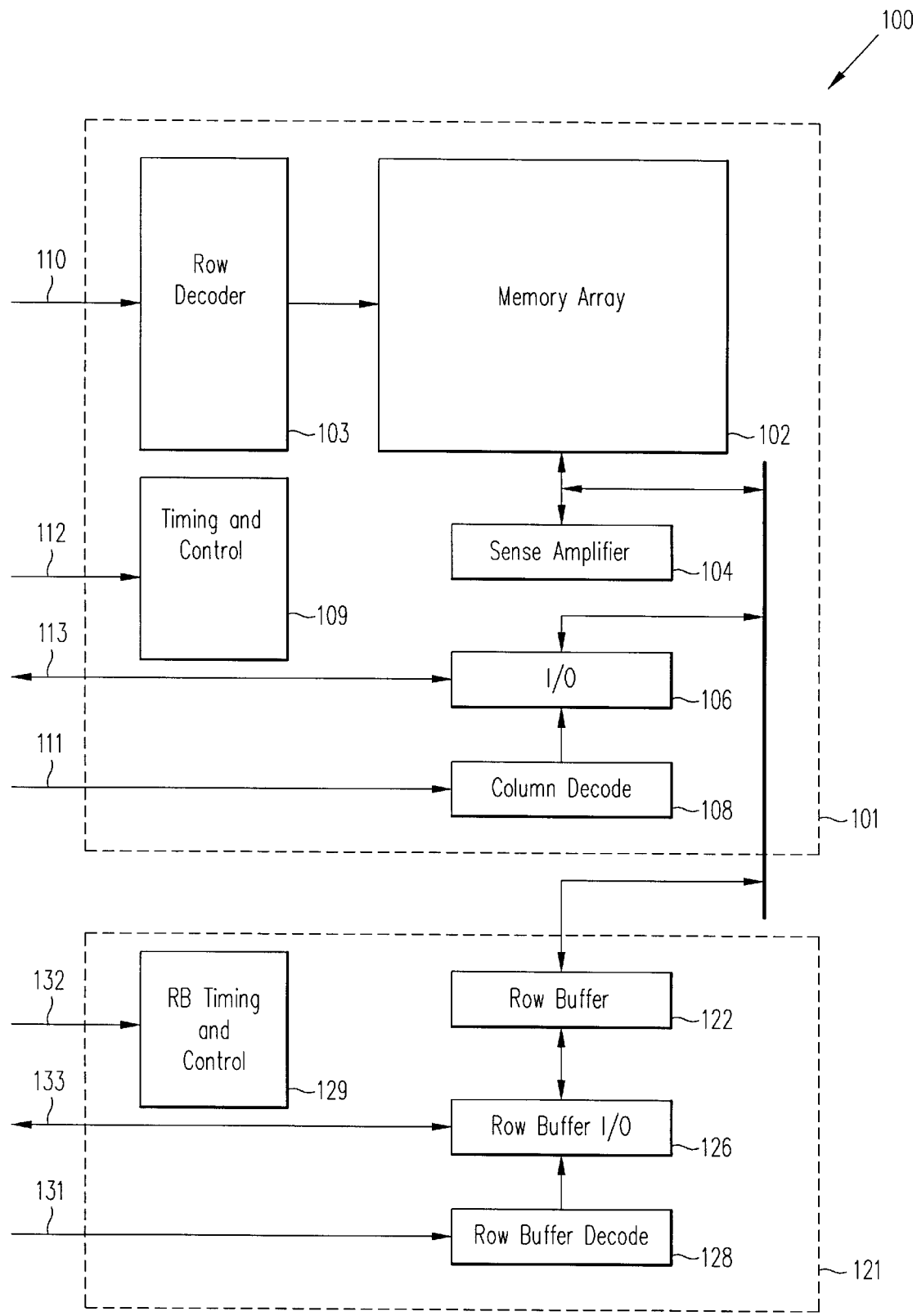
FIG. 2 shows the block diagram of a multiport DRAM of prior art.
Figure 3:
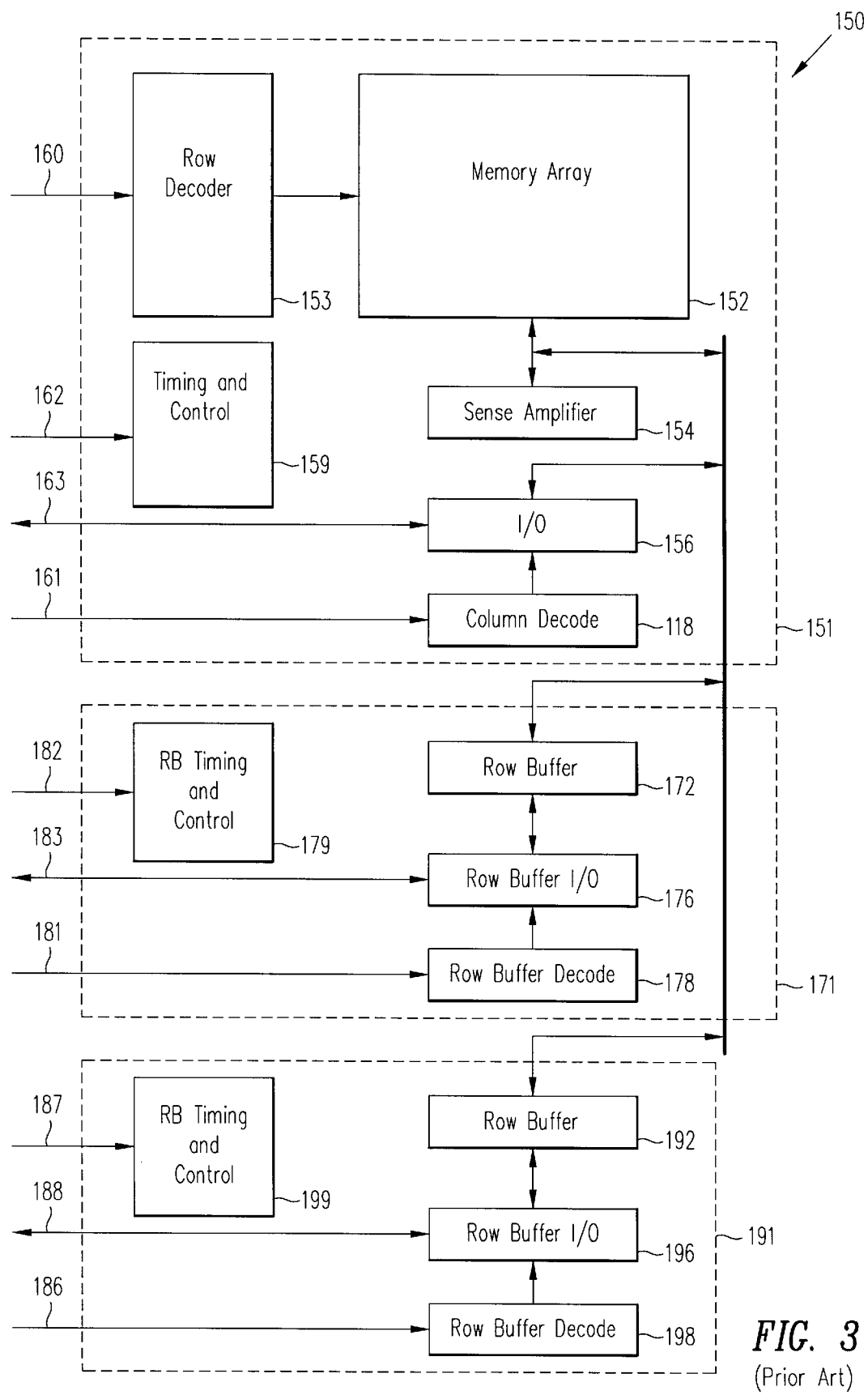
FIG. 3 shows an extension of multiport DRAMs of prior art.
Figure 4:
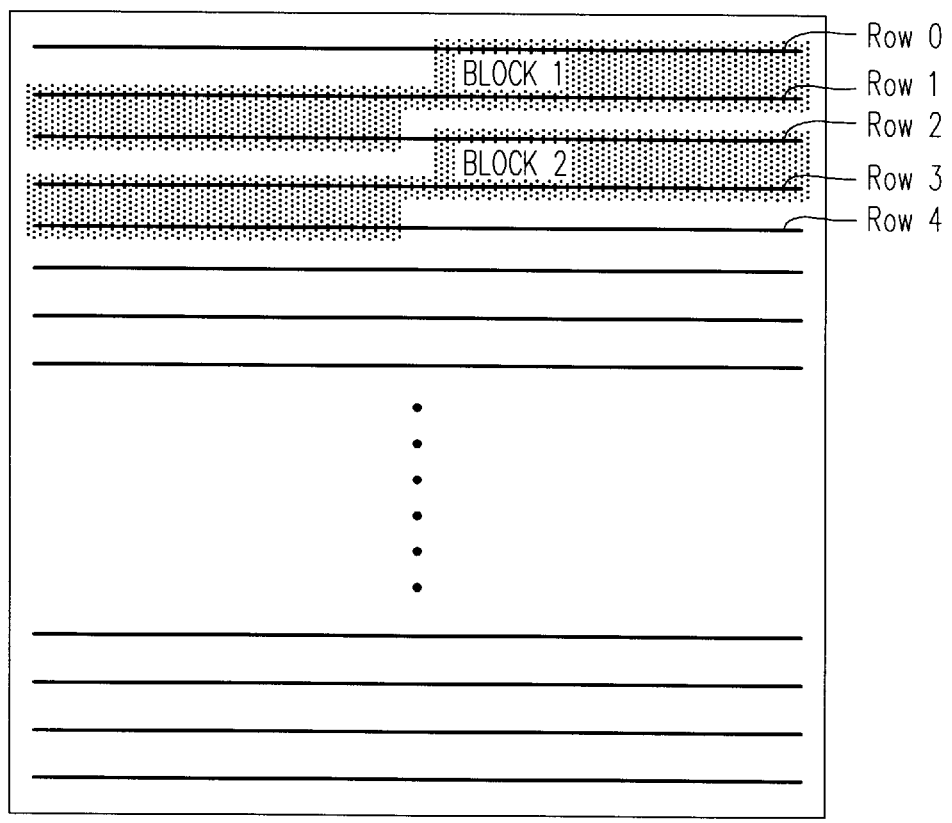
FIG. 4 shows two blocks of data in the memory wherein a row of the memory partially is included in both.
Figure 12:
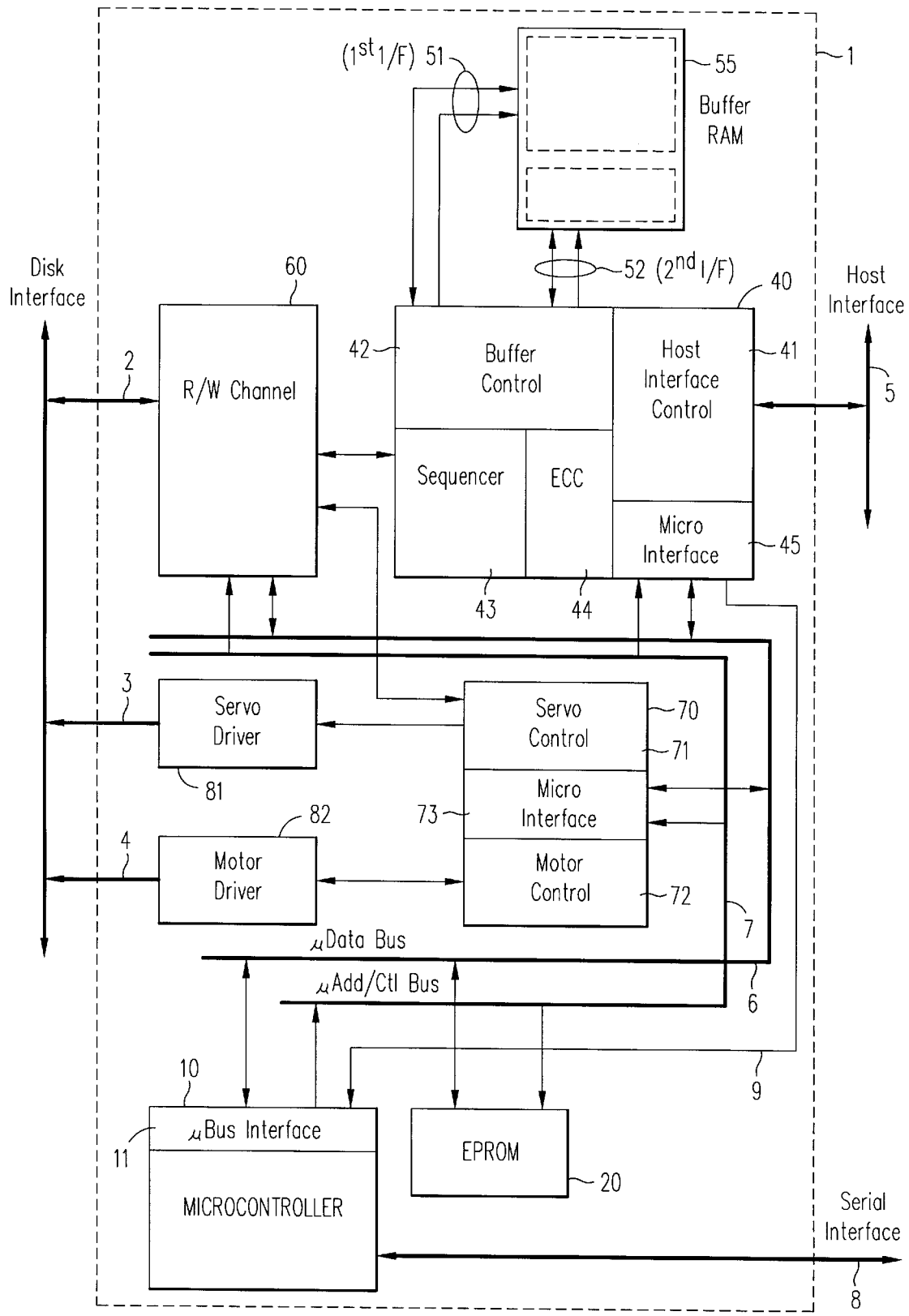
FIG. 12 illustrates the use of memory device in accordance with FIG. 5 in the electrical system of a winchester disk drive.

FIG. 12 shows an application of the memory device of FIG. 5a in the electrical system of a storage subsystem. FIG. 12 modifies the prior art system depicted in FIG. 1 by eliminating the code/data RAM 30 and replacing buffer RAM 50 with the memory device of the present invention 55. In the system of FIG. 12, RAM 50 is used for storage and retrieval of code executed by the microcontroller 10, data and variables used by the microcontroller 10, temporary data during transfer between host interface 5 and the disk interface 2, cached data of the storage system. Furthermore, the buffer control 42 controls access to the first interface 51 and second interface 52 of the buffer RAM 55. The microcontroller 10 access to RAM 55, the ECC 44 access to RAM 55 for read-modify-write error correction, and transfers between the main memory and the secondary memory of the RAM 55, are coupled through buffer control 42 to the first interface 51 of RAM 55. The host interface control 41 access to RAM 55, and the sequencer access to RAM 55 are coupled through buffer control 42 to the second interface 52 of RAM 55. The microcontroller address/control bus 7 includes control signal to indicate microcontroller 10 access to the RAM 55. The controller 40 provides a programmable open drain output $\overline{READY}$ 9 for the microcontroller to cause insertion of wait states in the microcontroller 10 bus cycles for completion of the access to RAM 55 or controller 40.

The main memory RAM 55 is 128K×8 DRAM with access time of 70 ns (cycle time of 130 ns) configured as 512 rows of 256 bytes. The secondary memory includes data register file having 8 rows and mask register file having 8 rows. Each block is 516 bytes having 512 bytes of data and 4 bytes of cyclic redundancy check (CRC). Each block of data may span up to 3 rows including a complete row (256 bytes) and two partial rows. A partial row is a row wherein not all data in the row is part of the block and the size of a partial row of a block is the number of bytes in the row that are part of the block. In this example, the size of a partial row varies from 4 to 252 bytes. The disk data rate is up to 160 Mbits/sec (20 Mbytes/sec) and the host interface transfer rate is 20 Mbytes/sec.

The buffer control 42 includes a first arbiter for arbitration of accesses to the first interface 51 of RAM 55 and a second arbiter for arbitration of accesses to the second interfaces 52 of the RAM 55. The following are the requests (ordered in priority) coupled to the first arbiter:

1) Microcontroller
2) Refresh
3) 1st Transfer between main memory and secondary memory for disk interface
4) 1st Transfer between main memory and secondary memory for host interface
5) ECC The following are the requests (ordered in priority) coupled to the second arbiter:

1) disk access to secondary memory
2) host access to secondary memory

The first arbiter is a time sliced arbiter which dedicates 650 ns to the requests by the microcontroller and then allows only one access(read, write, or read modify write access) to the first interface of RAM 55 for any of the pending requests 2–5 and then again dedicates the next 650 ns to accesses by microcontroller followed by one allowed access by other requests. A minimum 77% of bandwidth is dedicated to microcontroller requests and the rest allowed for any pending requests 2–5 and if there is no pending requests 2–5, the microcontroller will use that allocated time for requests 2–5.

The bandwidth required through 1st interface of RAM 55 for transfer between main memory and secondary memory for disk interface accessing a single block of 516 bytes through the 2nd interface at a transfer rate of 20 MBytes/sec is 3 accesses in 25.8 usec or 0.117 MAccess/sec. The bandwidth required through 1st interface of RAM 55 for transfer between main memory and secondary memory for host interface accessing a single block of 516 bytes through the 2nd interface at a transfer rate of 20 MBytes/sec is 3 accesses in 25.8 usec or 0.117 MAccess/sec. The ECC on the fly correction is performed in a Read Modify Write (RMW) cycle, the RMW cycle is 185 ns. The number of errors corrected by the ECC (and hence the number of RMW cycles) is a function of the ECC code employed. In this particular controller 40, the ECC is a programmable 3-way Reed-Solomon code which can correct up to 9 bytes per block and the correction is typically performed in about half a block transfer time (12.9 usec). The bandwidth required by ECC to perform "on the fly correction" is 9 RMW accesses in 12.9 usec or 0.698 MAccess/sec. The bandwidth required for DRAM REFRESH operation is 512 accesses in 8 msec or 0.064 MAccess/sec. The sum of bandwidth required for requests 2–5 is 0.996 MAccess/sec. The bandwidth allocated for requests 2–n is $\frac{1}{650}$=1.53 MAccess/sec.

As mentioned earlier, the bandwidth on the 2nd interface of RAM 55 exceeds 40 Mbytes/sec requirement of this application.

The buffer control 42 further includes a host transfer control and a disk transfer control to generate requests for access to the first and second interface of the RAM 55 for managing block transfers.

Figure 13A:
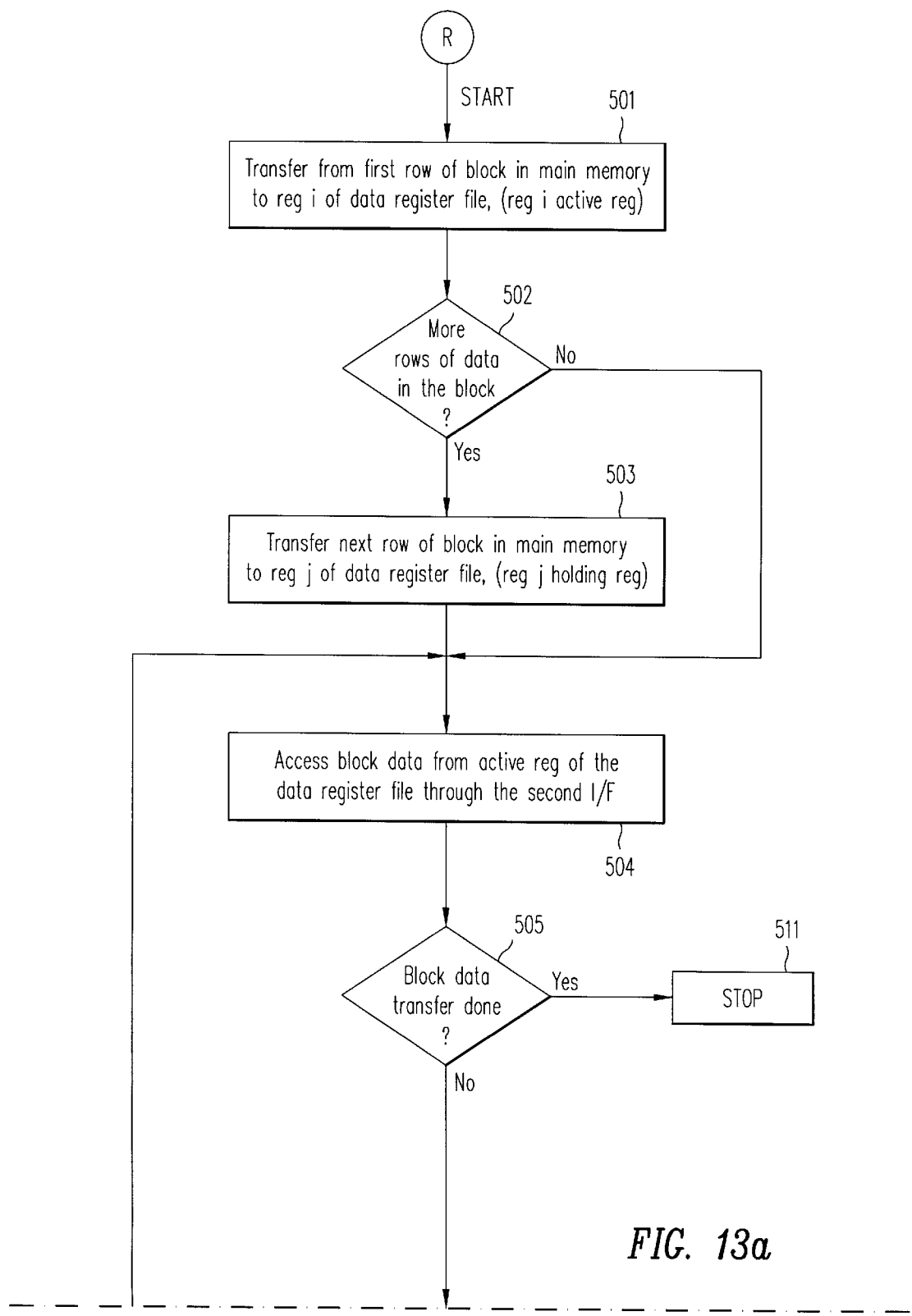
FIG. 13 shows the flow chart for managing requests to the first and second interface of a memory device of the present invention in a single block read operation.
Figure 13B:
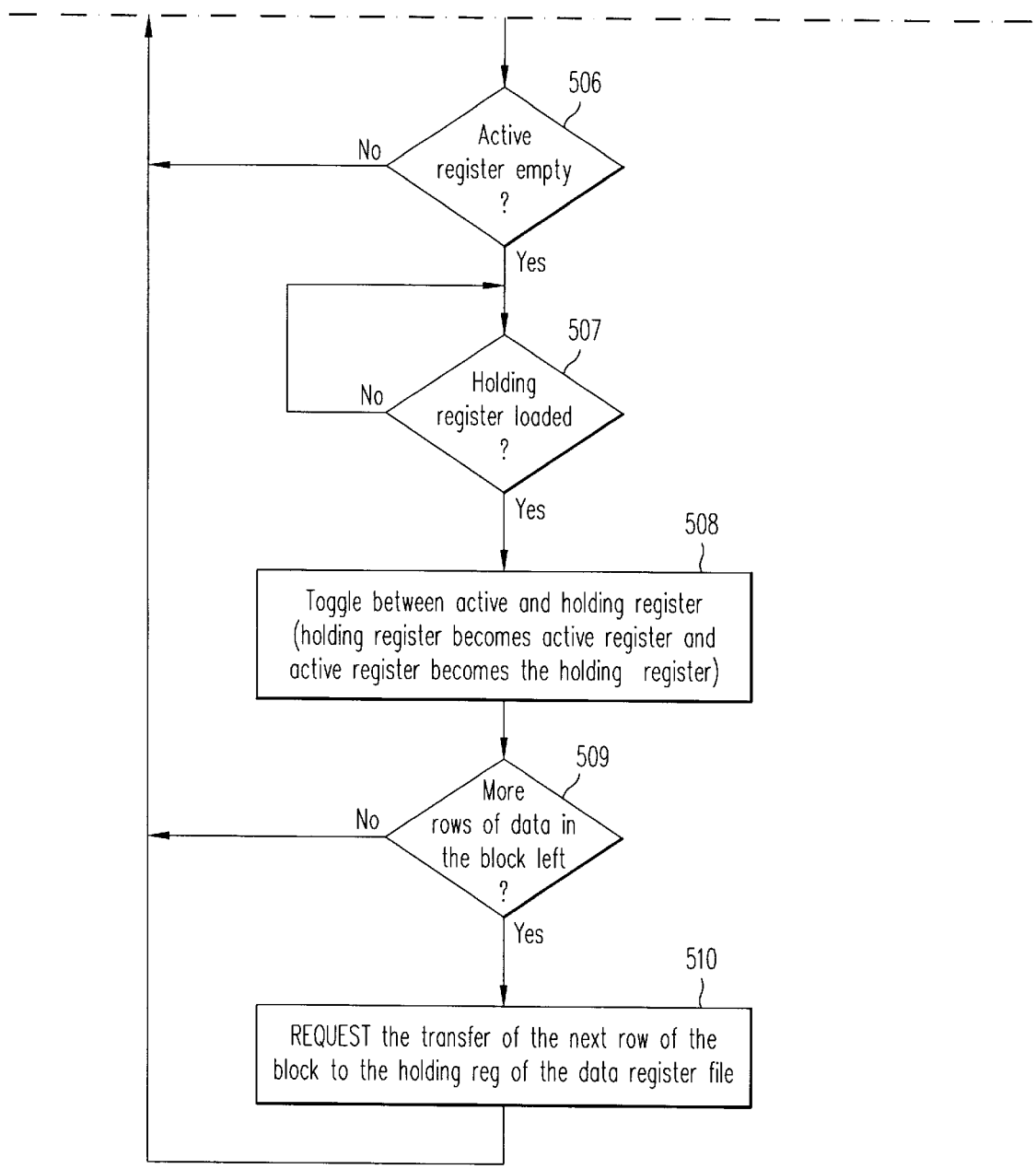

To illustrate the operation of host transfer control and disk transfer control FIG. 13 shows a flow chart of single block read operation to generate requests for access to the first and second interface of the RAM 55 for managing block transfers. For a read operation, two registers of data register file i and j are dedicated for block transfer. These two registers one active, the other holding, act as two ping-pong registers. The active register will become holding and the holding register will become active. The transfer will be from the active register and in parallel the holding register is loaded.

At step 501, generate a request to transfer the first row of the block in main memory to row i of the data register file (through the first interface) and wait for completion of transfer. At step 502, check if any more rows left in the block. If at step 502, there is no more rows left in the block, go to step 504; else go to step 503. At step 503, generate a request to transfer the next row of the block in main memory to row j of the data register file (through the first interface) wait for completion of transfer; and then move to step 504. At step 504, request transfer of a word from the active register through the second interface of RAM 55; after completion of the request, move to step 505, and check if block transfer is complete. If at step 505 the block transfer is complete, move to step 511 and stop; else go to step 506. At step 506, check if the data of the block in the active register is read. If at step 506, all the data in the active register is accessed and the active register is empty go to step 507; else go back to step 504. At step 507, check that the holding register is loaded. If the holding register was loaded, go to step 508; else wait until the holding register is loaded. At step 508, ping-pong between the two registers the holding register becomes the active register and the active register becomes the holding register. Go to step 509. At step 509, check if any more rows are left in the block. If at step 509, there is no more rows left in the block, go back to step 504; else go to step 510. At step 510, generate a request to transfer the next row of the block in main memory to the holding register in the data register file through the first interface) but do not wait for completion of the request and move back to step 504.

The present invention provides data in a block at the requested transfer rate without any interruption in the data stream once block transfer starts (no intra-transfer gaps). It should be apparent to a person skilled in the art that given the size of a register, arbitration scheme, and the above flow chart the pending request at step 510 should be completed prior to getting back to step 507.

For multiple block transfer, the same flow chart can be used if inter-block transfer delays are acceptable. The inter block transfer delay is the delay of executing steps 501–503 for the next block of the multiple block transfer.

The above flow chart can be easily extended by a person of ordinary skill in the art to eliminate the inter block transfer delay. This can be achieved by allocating an additional set of two registers in the data register file for the next block. Following the allocation, requesting transfer of the first two rows of the next block from the main memory to the next register set in the data register file during the transfer current block transfer and further adding an additional request 6 with a lower priority. The excess bandwidth in the design for requests 2–n can easily accommodate this extra request.

Figure 14A:
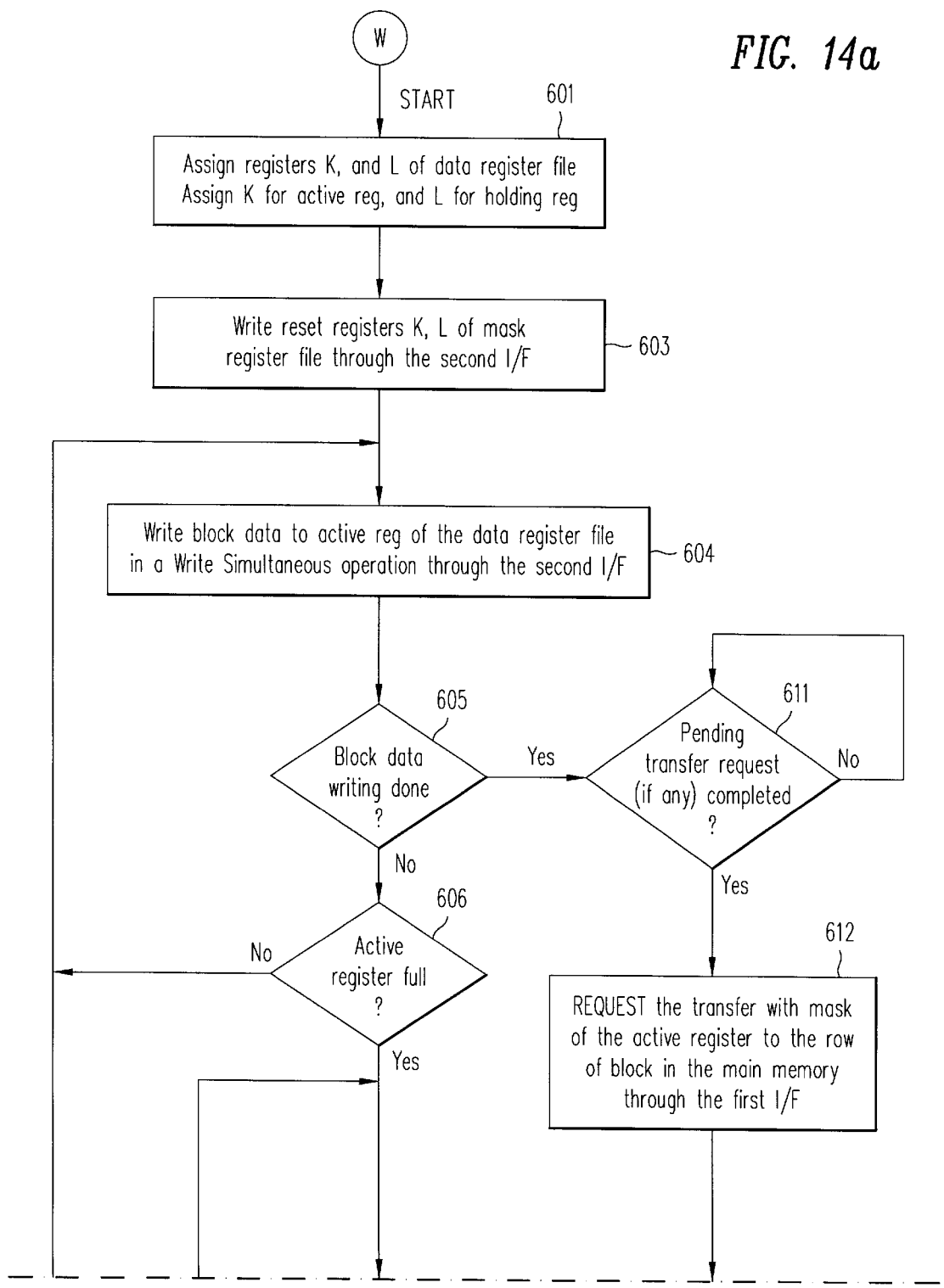
FIG. 14 shows the flow chart for managing requests to the first and second interface of a memory device of the present invention in a single block write operation.

To further illustrate the operation of host transfer control and disk transfer control, FIG. 14 shows a flow chart of single block write operation to generate requests for access to the first and second interface of the RAM 55 for managing block transfer. For a write operation, two registers of data register file k and l are dedicated for block transfer. These two registers one is active the other holding, act as two ping-pong registers. The active register will become holding and the holding register will become active. The transfer will be from the active register and in parallel the holding register is transferred to main memory row.

At step 602, generate a request to reset the mask register associated with register k (through second interface write reset operation) and after completion move to step 604. At step 604, request transfer of a word to the active register through the second interface of RAM 55 (simultaneous write operation). After completion of the request, move to step 605; and at step 605, check if block transfer is complete. If at step 605, the block transfer is complete, move to step 611; else go to step 606. At step 606, check if the active register is full. If at step 606, the active register is full, go to step 607; else go back to step 604. At step 607, check if a previous request to transfer the holding register to main memory is completed. If the holding register was transferred, go to step 608; else wait until the holding register is transferred. At step 608 ping-pong between the two registers the holding register becomes the active register, and the active register becomes the holding register. Go to step 609. At step 609, generate a request to reset the mask register associated with the active register (through second interface write reset operation). After completion move to step 610. At step 610, generate a request to transfer with mask the holding register to the row of the block in the main memory (through the first interface), but do not wait for completion of the request and move back to step 604.

At step 611, check if there is any pending transfer requests and then wait for completion of the pending transfer and go to step 612; else, if there is no pending transfer requests, go to step 612. At step 612, generate a request to transfer with mask the active register to the row of the block in the main memory (through the first interface) and go to step 613. At step 613, wait for completion of the pending request and after completion of the pending transfer request, go to step 614 and stop.

It is an object of this invention to provide data of a block at the requested transfer rate without any interruption in the data stream once block transfer started (no intra-transfer gaps). It should be apparent to a person skilled in the art that given the size of a register, arbitration scheme, and the above flow chart that the pending request at step 610 should be completed prior to getting back to step 607.

For multiple block transfer, the same flow chart can be used if inter-block transfer delays are acceptable. The inter block transfer delay is the delay of waiting for completion of any pending transfer requests at steps 611 and 612.

The above flow chart can be easily extended by a person ordinary skilled in the art with the benefit of reading this disclosure to eliminate the inter block transfer delay by allocating an additional set of two registers of the data register file for the next block, and allowing multiple simultaneous transfer requests to overlap transfer requests for two blocks. The excess bandwidth in the design for requests 2–n can easily accommodate this extra request.

I claim:

1. A disk storage system comprising:
   (a) a memory device including:
      a main memory coupled to a first parallel-by-bit interface having data, address and control ports, said main memory having an array of memory cells having rows and columns to store a plurality of n-bit words, each row addressable by a first decoder and a sense amplifier for each column, each word selectable by a second decoder, said main memory having input/output capability to transfer data to and from the storage location of a selected word;
      a secondary memory coupled to a parallel-by-bit second interface having input/output ports, address ports and control ports, said secondary memory having a data memory to store data transferred to and from the storage locations of the main memory and a mask memory to store a write mask corresponding to each word of the data memory, each of said data and mask memories having a plurality of rows of memory cells each row having the same number of bits as a row of the main memory;
      an operation circuit coupled to said second interface and to said secondary memory for transferring data to and from said second interface and to said secondary memory for transferring data to and from said secondary memory through data input/output ports of said second interface substantially independent of accesses to said main memory;
   (b) a disk controller having an ECC circuitry capable of detecting and correcting errors in the data read from the disk, a microcontroller to execute instructions stored in the storage locations of said of said main memory, a sequencer for controlling read, write and format operations of the disk, a host interface for communicating with the host, a buffer controller for accessing said memory device, said buffer controller being coupled to said first and second interfaces of the memory device and further including means for arbitrating microcontroller and ECC accesses to the memory device through said first interface concurrently with and independently of memory device accesses by said host interface and sequencer through said second interface.

2. A disk storage system as claimed in 1 wherein said sequencer accesses data stored in the semiconductor memory device through said second interface for disk operations simultaneously with microcontroller or ECC accesses of the semiconductor memory device through said first interface.

3. A disk storage system as in claim 1 further including means coupled to said first interface for transferring data between said main memory and secondary memory.

4. A disk storage system as claimed in 3 wherein said means for transferring includes transfer circuitry to move data from a row of main memory into a row of the secondary memory or to move any combination of words from a row of data memory into a row of main memory, wherein the combination is selected by the contents of the corresponding row in the mask memory.

5. A disk storage system as in claim 1 wherein said buffer controller includes a first arbiter for arbitration of accesses to said first interface and a second arbiter for arbitration of accesses to said second interface.

6. A disk storage system according to claim 1 wherein said second interface includes an operation select control signal.

7. A disk storage system according to claim 6 wherein said operation circuit further, during the transfer of signals on the input/output ports of the second interface to a word of said data memory in response to said operation select signal concurrently writes a first predetermined pattern to the corresponding word of said memory, said first predetermined pattern including a write mask value corresponding to selecting all the bits of a word during transfer operation from the data memory to the main memory.

8. A disk storage system according to claim 1 wherein said second interface includes a reset control signal.

9. A disk storage system according to claim 8 wherein said operation circuit further, during the transfer of signals on the input/output ports of the second interface to a word of said mask memory in response to said reset control signal, concurrently writes a second predetermined pattern to the row of said mask memory containing the addressed word, wherein the predetermined pattern is a write mask value corresponding to deselecting all the bits of a row during transfer operation from the data memory to the main memory.

10. A disk storage system according to claim 1 wherein said second interface includes a clock port.

11. A disk storage system according to claim 10 wherein operations through said second interface are synchronized to a signal on said clock port.

12. A disk storage system according to claim 1 wherein said operation circuit further includes:
  (a) a third addressing means coupled to said second interface and to the secondary memory, for selecting each row of the secondary memory,
  (b) a fourth addressing means coupled to the second interface for selecting a word of said row,
  (c) a second input/output circuit means coupled to the second memory and further coupled to input/output lines of the second interface for accessing said selected word,
  (d) a second logic circuit means for generating timing and control signals having output ports coupled to said third addressing means, said fourth addressing means, and the second input/output circuit means.

13. A disk storage system according to claim 1 wherein said operation circuit further comprises:

(a) a plurality of address counters each associated with a row of said data memory each containing the address of the next word writing the row of said secondary memory that can be accessed,
  (b) means to initialize the address counter with a start address,
  (c) a third addressing means coupled to said second interface and to said secondary memory for selecting a row of the secondary memory and its associated counter;
  (d) a fourth addressing means coupled to said selected counter for selecting a word of the selected row of said secondary memory;
  (e) a second input/output circuit means coupled to said secondary memory and further coupled to input/output ports of said second interface for accessing said selected word; and
  (f) a second logic circuit means for generating timing and control signals having output ports coupled to said third addressing means, said fourth addressing means, and said second input/output circuit means.

14. A disk storage system according to claim 1 wherein said plurality of said memory cells of said secondary memory defining a register.

15. A disk storage system according to claim 14 wherein said register has a first input/output port and a second input/output port.

16. A disk storage system comprising:
  (a) a semiconductor memory device including;
    (i) a main memory having storage locations organized as an array of memory cells having rows and columns to store a plurality of n-bit words;
    (ii) a secondary memory having a data memory having storage locations organized as an array of memory cells having rows and columns, each row having the same number of words as a row of the main memory;
  (b) a disk controller coupled to said semiconductor memory device and having a buffer controller for arbitrating accesses to said memory device, a sequencer to control read, write and format disk operations, an ECC logic to detect and correct disk data errors, a host interface means coupled to the host bus for communicating with the host, and a microcontroller interface means coupled to a microcontroller for communicating with the host;
  wherein said ECC logic and microcontroller access the memory device through said buffer controller concurrently with and substantially independently of accesses by said host interface and sequencer.

17. A disk storage system as in claim 16 further having a first interface coupled to the main memory having a parallel-by-bit bidirectional data port, an address port and a control port.

18. A disk storage system as in claim 17 wherein said secondary memory further includes a mask memory having storage locations organized in an array of rows and columns, each row having a plurality of n-bit words corresponding to words of the data memory, said mask memory being for storing a write mask.

19. A disk storage system as in claim 18 wherein a predetermined pattern of binary values defining a write mask is stored in the mask memory for determining the bits to be transferred from the corresponding words of the data memory to the main memory.

20. A disk storage system as in claim 19 further having a second interface coupled to said secondary memory and having a parallel-by-bit data port, a control port and an address port.

21. A disk storage system as in claim 20 further having an operation circuit coupled to the second interface and to the secondary memory for transferring data through data input/output ports of said second interface.

22. A disk storage system according to claim 21 wherein said operation circuit further comprises:
   (a) a plurality of address counters each associated with a row of said data memory each containing the address of the next word within the row of said secondary memory that can be accessed,
   (b) means to initialize the address counter with a start address
   (c) a third addressing means coupled to said second interface and to said secondary memory for selecting a row of the secondary memory and its associated counter;
   (d) a fourth addressing means coupled to said selected counter for selecting a word of selected row of said secondary memory;
   (e) a second input/output circuit means coupled to said secondary memory and further coupled to input/output ports of said second interface for accessing said selected word;
   (f) a second logic circuit means for generating timing and control signals having output ports coupled to said third addressing means, said fourth addressing means, and the second input/output circuit means.

23. A disk storage system as in claim 16 further having transfer means coupled between said main and secondary memories for transferring data therebetween.

24. In a disk storage system having a disk controller coupled to a semiconductor memory device having a buffer controller for arbitrating accesses to said memory device, a sequencer to control read, write and format disk operations, an ECC logic to detect and correct disk data errors, a host interface means coupled to the host but for communicating with the same, and a microcontroller interface means coupled to a microcontroller for communicating with the same, a method employing the semiconductor memory device, the method comprising:
   (a) providing a main memory and a secondary memory in the memory device for data storage, both memories organized as an array of memory cells of rows and columns, each row having a plurality of n-bit words wherein the number of words in a row of said secondary memory is the same as a row of said main memory;
   (b) providing a transfer circuit coupled to said main memory and secondary memory for transferring data therebetween;
   (c) the ECC logic and microcontroller accessing the memory device through the buffer controller concurrently with and substantially independently of accesses by the host interface and sequencer.

25. A method in a disk storage system as in claim 24 wherein said accessing step (c) by the ECC logic and microcontroller is performed through a first interface coupled to the main memory, said first interface having a parallel-by-bit bi-directional data port, an address port and a control port.

26. A method in a disk storage system as in claim 25 wherein said accessing step (c) by the host interface and sequencer is performed through a second interface coupled to the secondary memory, said second interface having a parallel-by-bit bi-directional data port, an address port and a control port.

27. A method in a disk storage system as in claim 26 further comprising:
   (a) defining a data memory and a corresponding mask memory within the secondary memory, each of said data and mask memories being organized in an array of storage locations having rows and columns, each row having a plurality of n-bit words and further having the same number of words as a row in the main memory; and
   (b) storing a write mask defined by a predetermined pattern of binary values in said mask memory.

28. A method in a disk storage system as in claim 27 wherein the bits to be transferred from the corresponding words of the data memory to the main memory are determined from the binary values of the write mask.

29. A method in a disk storage system as in claim 28 further having an operation circuit coupled to the second interface and to the secondary memory for transferring data therebetween through data input/output ports of said second interface.

30. A method in a disk storage system having a microcontroller, ECC capability, a host interface and a sequencer, said disk storage system further employing a memory device for storage of program code executed by a microcontroller and for storage of data, a buffer controller for controlling accesses to the memory device through a first and a second arbiter, the memory device having a main memory having an array of memory cells having rows and columns to store a plurality of n-bit words, each row addressable by a first decoder, a sense amplifier for each column, each word selectable by a second decoder, said main memory having input/output capability to transfer data to and from said selected word, said memory device further including a first interface having parallel-by-bit data input/output ports coupled to the input/output of the main memory, a secondary memory having a data memory to store data transferred to and from said main memory and having a plurality of rows of memory cells each row having the same number of bits as a row of the main memory, said memory device further having means coupled to said main memory and said secondary memory for transferring data between the same, a second interface having parallel-by-bit data input/output ports, address ports and control ports, a method for reading a block of data from said memory device through the second interface during and independently of accesses to the same block of data in the main memory through the first interface wherein the block spans more than one row and less than the number of rows in the secondary memory, said method comprising:
   (a) designating a first predetermined register and a second predetermined register both contained in the secondary memory as active register and holding register respectively;
   (b) transferring the first row of a block from main memory to said active register through the first interface;
   (c) upon determining the block contains additional rows transferring the next row of the block from the main memory to said holding register through the first interface, otherwise continuing to step (d);
   (d) reading a word from the active register through the second interface;
   (e) stopping upon completion of block transfer, otherwise continuing to step (f);
   (f) upon determining there are remaining unread words of the active register, repeating steps (d) and (e);
   (g) waiting for completion of loading of the holding register;
   (h) swapping designation of active register to holding register and holding register to active register;

(i) upon determining the block contains remaining unread rows, transferring a subsequent row of the block as the next row to be transferred to the holding register; and (j) continuously repeating the above steps starting from step (d).

31. A method as in claim 30 wherein the microcontroller or ECC capability access the first interface substantially independently of said reading of step (d) by the disk or host.

32. A method as in claim 30 further including selecting the active register by applying predetermined signals representing the address of the active register to the address port of the second interface prior to said transferring of step (b).

33. In a disk storage system having a microcontroller, ECC capability, a host interface and a sequencer, said disk storage system further employing a memory device for storage of program code executed by the microcontroller and for storage of data, a buffer controller for controlling accesses to the memory device, the memory device having a main memory having an array of memory cells having rows and columns to store a plurality of n-bit words, each row addressable by a first decoder, said main memory having input/output capability to transfer data to and from said selected word, said memory device further including a first interface having a parallel-by-bit data input/output ports coupled to the input/output of the main memory, a secondary memory having a plurality of rows of memory cells each row having the same number of bits as a row of the main memory, said secondary memory further having a data memory to store data transferred to and from said main memory and a corresponding mask memory to store a write mask corresponding to each word of the data memory and having the same number of rows as the secondary memory wherein each row of said mask memory corresponds to a row of said data memory, said memory device further having means coupled to said main memory and said secondary memory for transferring data between the same, a second interface having parallel-by-bit data input/output ports, address ports, address ports and control ports, a method for writing a block of data to said memory device through the second interface substantially independently of accesses to the same block of data in the main memory through the first interface wherein the block spans more than one row and less than the number of rows in the secondary memory, said method comprising:

(a) designating a first predetermined register and a second predetermined register both contained in the secondary memory as an active register and a holding register, respectively;

(b) initializing said active and holding registers to a first predetermined value;

(c) writing a word to the active register through the second interface wherein said writing simultaneously updates the corresponding mask register with a second predetermined value;

(d) upon completion of block writing, continuing to step (k);

(e) upon determining last word of the active register has not been written, repeating steps (c) and (d);

(f) waiting for completion of writing the holding register in to the main memory;

(g) swapping designation of active register to holding register and holding register to active register;

(h) initializing said mask register with said first predetermined value through the second interface;

(i) transferring the holding register to a row of the block in the main memory wherein updating the words of the main memory depends upon the contents of the corresponding mask register;

(j) repeating steps (c)–(i);

(k) waiting for completion of writing of holding register into the main memory; and (l) transferring the active register to a row of the block in the main memory wherein the words of the main memory are updated as corresponding to the contents of the mask register.

34. A method as in claim 33 wherein the microcontroller or ECC capability access the first interface substantially independently of said writing of step (c) by the disk or host through the second interface.

35. A method as in claim 33 further including selecting the active register by applying predetermined signals representing the address of the active register to the address port of the second interface prior to said initializing of step (b).

36. A method as in claim 33 wherein performing of said updating step (i) only occurs on the main memory data words for which said corresponding word in the mask register contains said first predetermined value and does not occur when the corresponding word in the mask register contains said second predetermined value.

37. A method as in claim 36 wherein said first predetermined value contains an all '1's pattern and said second predetermined value contains an all '0's pattern.

* * * * *